United States Patent
Majumder et al.

(12) United States Patent Majumder et al.

(10) Patent No.: US 8,640,078 B2
(45) Date of Patent: Jan. 28, 2014

(54) METHOD AND SYSTEM FOR SEARCHING FOR GRAPHICAL OBJECTS OF A DESIGN

(75) Inventors: Chayan Majumder, Delhi (IN); Sagufta Siddique, New Delhi (IN)

(73) Assignee: Cadence Design Systems, Inc., San Jose, CA (US)

(*) Notice: Subject to any disclaimer, the term of this patent is extended or adjusted under 35 U.S.C. 154(b) by 414 days.

(21) Appl. No.: 12/716,183

(22) Filed: Mar. 2, 2010

(65) Prior Publication Data

US 2011/0219320 A1 Sep. 8, 2011

(51) Int. Cl.
*G06F 17/50* (2006.01)

(52) U.S. Cl.
USPC ........... 716/139; 716/100; 716/101; 716/102; 716/103; 716/104

(58) Field of Classification Search
USPC ................. 716/100–104, 139, 118–119, 122
See application file for complete search history.

(56) References Cited

U.S. PATENT DOCUMENTS

| | | | | |
|---|---|---|---|---|
| 5,592,392 A * | 1/1997 | Matheson et al. | ............ | 716/119 |
| 5,625,564 A * | 4/1997 | Rogoyski | ............ | 716/51 |
| 7,013,028 B2 * | 3/2006 | Gont et al. | ............ | 382/113 |
| 7,657,852 B2 * | 2/2010 | Waller | ............ | 716/119 |
| 7,735,036 B2 * | 6/2010 | Dennison et al. | ............ | 716/106 |
| 7,818,707 B1 | 10/2010 | Gennari et al. | | |
| 7,984,392 B2 * | 7/2011 | Fu | ............ | 716/52 |
| 2010/0185994 A1 * | 7/2010 | Pikus et al. | ............ | 716/5 |
| 2011/0066996 A1 * | 3/2011 | Koyuncu et al. | ............ | 716/126 |

OTHER PUBLICATIONS

Goering, R., EE Times Asia, "Cadence buys DFM startup from U.C. Berkeley", May 18, 2007, http://www.eetasia.com, US, 4 pages.

* cited by examiner

*Primary Examiner* — Nghia Doan
(74) *Attorney, Agent, or Firm* — Sawyer Law Group, P.C.

(57) ABSTRACT

Searching for graphical objects of a design using a computer system. In one aspect of the inventions, a method includes defining a graphical search pattern based on input received from a user in a graphical interface displayed on a display device, where the search pattern is a graphical object and is defined with a plurality of types of characteristics. The graphical design is searched for all matching instances of graphical objects in the design that match the search pattern and match the characteristics specified by the search pattern. At least one of the matching instances is caused to be displayed on the display device as a result of the searching.

26 Claims, 23 Drawing Sheets

METHOD AND SYSTEM FOR SEARCHING FOR GRAPHICAL OBJECTS OF A DESIGN

CROSS REFERENCE TO RELATED APPLICATIONS

The present application is related to copending U.S. patent application Ser. No. 12/716,215, entitled "Method and System for Searching and Replacing Graphical Objects of a Design," filed on even date herewith and assigned to the assignee of the present invention.

FIELD OF THE INVENTION

The present invention relates to graphical design implemented by computer systems, and more particularly to finding and replacing graphical objects of a design using a computer system.

BACKGROUND OF THE INVENTION

Computer-enabled graphical editing systems are used in a wide variety of different applications and industries to view and edit different types of visual images on computer systems or other electronic devices. One common application is electronic design automation, including such applications as layout design, in which the circuit structures for components and spatial layout of electronic components such as transistors, integrated circuits and circuit boards are viewed, created and edited using displayed images. Another application is schematic design, in which symbols represent the components of the electronic design and are connected with other components. Various graphical application software is available to provide the display and editing functions for layout and schematic designs.

Custom graphical design, including both schematic design and layout design, involves mostly manual work. Hence, designer productivity is a key factor in design and productivity comparison is an important benchmark in graphical application evaluations. For example, designers often need to perform repetitive design edits to incorporate a specific design intent change, or to perform design correction. One example of such design edits and changes include searching out every occurrence of a transistor with particular dimensions and then increasing the poly end-cap by 2 microns for all of the transistors. Another example is detecting an aberration of a structure of specific dimensions on a Metal-3 layer for every occurrence of the structure and then correcting each of occurrence with a specific correction. Another example is increasing the magnification factor and finger width (which is the effective transistor gate width that determines transistor characteristics) by two for every schematic device that matches certain criteria and schematic properties. Generally, the designer's intent is to search for every occurrence of a specific schematic or layout object that has a particular property or other characteristic. A specific modification, correction, or replacement is then desired to be applied to all of the found occurrences.

Currently, there are two ways to perform these searching and editing tasks. The first way is to perform the searching and editing in a completely manual fashion. Due to the many instances and corrections in a large design, manual performance can therefore take days to perform. In addition, manual performance is typically highly error-prone due to the high degree of searching and large number of corrections required. The other way to perform the tasks is to write a program to automate the tasks. For example, the SKILL programming language can be used to create a program that will perform searches and edits of instances of a design. However, most graphical designers are not skilled at programming, and since programmers who can perform such tasks are usually unavailable, and since there are no graphical or other tools to make program creation simpler, the designers revert to using the time-consuming and tedious manual approach in the vast majority of cases.

In some cases, other software can be used to find a problem in a design that needs correcting, e.g., design portions that violate layout rules or other rules, but a designer would have to manually fix each problem found. Furthermore, even if a designer is able to program code to perform the tasks, coding such tasks and validating results is difficult and time consuming. In other particular cases, an existing CAD software tool such as "Éclair" can be used in layout designs to perform a structural search (not editing), but only in layout designs and not any other types of designs, and it is limited to only structural searches of physical dimensions of shapes and a restrictive type of structural tolerance search (only a single, one-way tolerance of all edges of a layout shape). In addition to these restrictions, existing tools like Éclair require involved manipulation of non-graphical input and output data files and programs by the user to create search patterns and provide results. Furthermore, the designer is required to manually fix each problem found. In any case, the designer is losing significant productivity when performing tasks of searching for and/or changing particular design objects with the limited existing tools.

SUMMARY OF THE INVENTION

The inventions of the present application relate to finding graphical objects of a design using a computer system. In one aspect of the inventions, a method for searching for graphical objects in a graphical design using a computer system includes defining a graphical search pattern based on input received from a user in a graphical interface displayed on a display device. The graphical design is searched for all matching instances of graphical objects that match the search pattern and match the characteristics specified by the search pattern. At least one of the matching instances is caused to be displayed on the display device as a result of the searching. A similar aspect is provided for a computer program product comprising a computer readable medium including program instructions for implementing similar features.

In another aspect, a system for searching for graphical objects in a graphical design includes a memory and at least one processor, the processor defines a graphical search pattern based on input received from a user in a graphical interface displayed on a display device, where the search pattern is a graphical object and is defined with a plurality of types of characteristics. The processor searches the graphical design for all matching instances of graphical objects that match the search pattern and match the characteristics specified by the search pattern. The processor causes a display of at least one of the matching instances on a display device as a result of the searching.

The present inventions present a powerful automatic graphically-based feature which designers can automate repetitive tasks of searching for and/or editing of graphical design objects, without the need to program code. The search functions of the inventions can allow designers to quickly, accurately, and efficiently find desired objects and/or make specific design changes and corrections regardless of how large or complex the design may be.

DETAILED DESCRIPTION

Figure 1A:
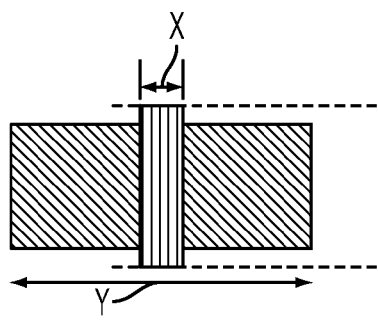
FIGS. 1A-1B, 2A-2B, and 3A-3B are diagrammatic illustrations of original and corrected structures of a layout design.

The present inventions relate to graphical design implemented by computer systems, and more particularly to finding and replacing graphical objects of a design using a computer system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular methods and systems provided in particular implementations. However, one of ordinary skill in the art will readily recognize that these methods and systems will operate effectively in other implementations. For example, the system implementations usable with the present invention can take a number of different forms. The present invention will also be described in the context of particular methods having certain steps. However, the method and system operate effectively for other methods having different and/or additional steps not inconsistent with the present invention.

The inventions herein can take the form of a software embodiment, a hardware embodiment, or an embodiment containing both hardware and software elements. A software embodiment can include but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk read only memory (CD-ROM), compact disk read/write (CD-R/W) and DVD.

The present inventions enable designers to search for a user-defined pattern in a graphical schematic or layout design. The inventions also enable designers to replace instances matching the search pattern with a replacement pattern in both schematic and layout designs. To enable the replacement ability, it enables a designer to specify a replacement pattern, and includes mechanisms for intelligent replacement of patterns. Replacement is performed in a fully automated or assisted manner, based on a structural, logical, or property-based match to the search pattern, or any combination of such. The inventions also can support connectivity-aware replacement and hierarchical replacement. These features are all provided without the need for any text- or language-based programming or coding. The inventions can be applied to any design tool or application that is suited for use with design layouts, integrated circuits and boards, or schematic designs.

Figure 1B:
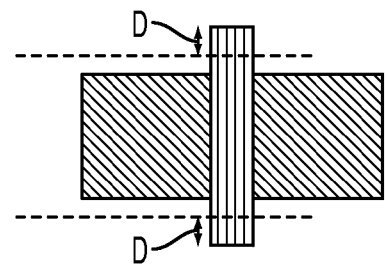
Figure 2A:
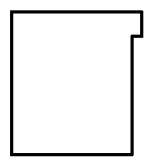
Figure 2B:
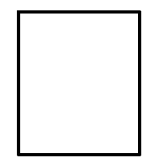
Figure 3A:
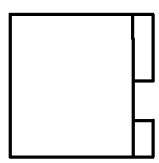
Figure 3B:
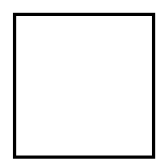
Figure 4A:
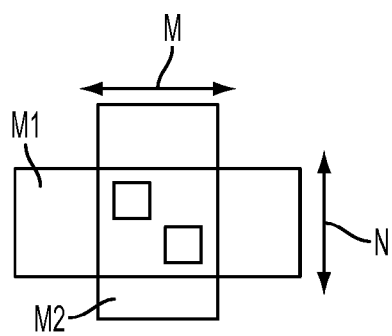
FIGS. 4A-4B, 5A-5B, and 6A-6B are further diagrammatic illustrations of original and corrected structures of a layout design.
Figure 4B:
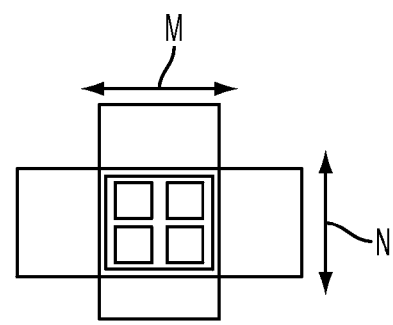

There are many different design edit or correction tasks where aspects of the present inventions can be useful. A first example in a large design includes more than 300 places at which a gate overhang must be increased by an amount D on both sides of only those transistors which have a gate of a particular length X and active length of Y, where the original layout is shown in FIG. 1A and the desired corrected layout is shown in FIG. 1B. In another example task shown in FIG. 2A (original) and FIG. 2b (corrected), every occurrence of an overhang on the layout structure in the cell view must be removed. In another example of a layout feature having a problem opposite to that of FIGS. 2A and 2B, symmetric and repeated arrangement of devices often create notches at many places after the design is flattened. Thus the original structure (FIG. 3A) should be corrected to have the notch filled (FIG. 3B). In another example task illustrated in FIG. 4a (original) and FIG. 4B (corrected), there are two vias located at an intersection of layers Metal 1 and Metal 2 in a structure, and the designer wants to search for intersections that are equal to or greater than a particular M×N cross section area, remove the existing two vias, add four vias of different electrical properties, and then stack a large single-cut M2-M3 via on top of the structure.

Figure 5A:
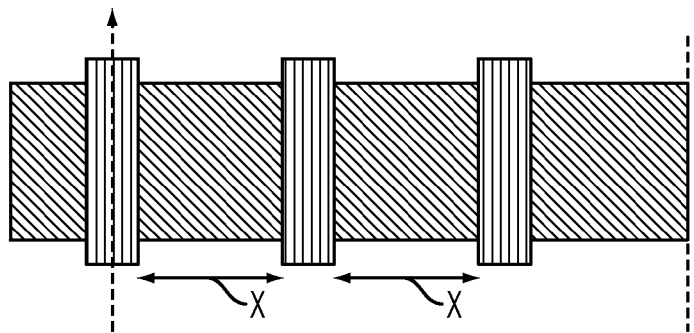
Figure 5B:
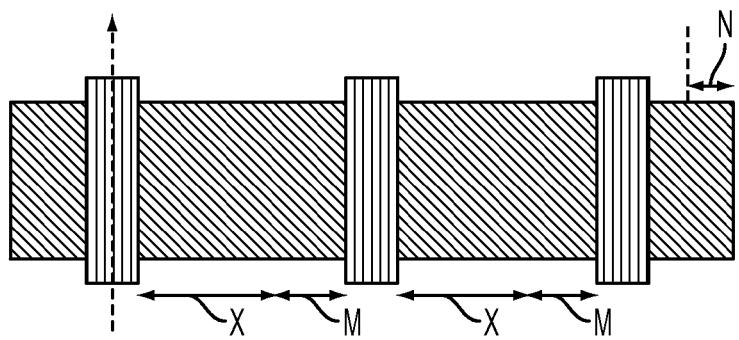
Figure 6A:
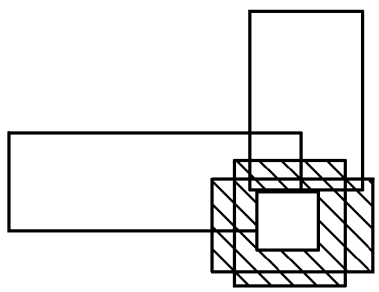
Figure 6B:
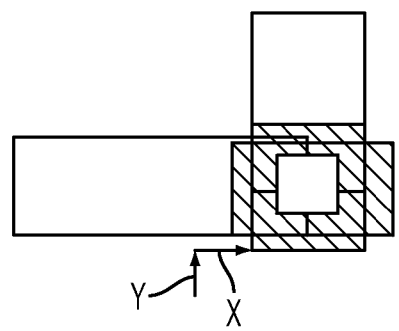
Figure 7A:
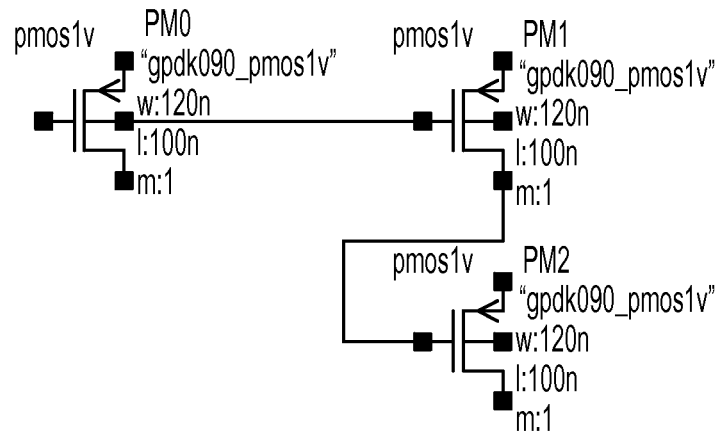
FIGS. 7A-7B and 8A-8B are diagrammatic illustrations of original and corrected circuits of a schematic design.
Figure 7B:
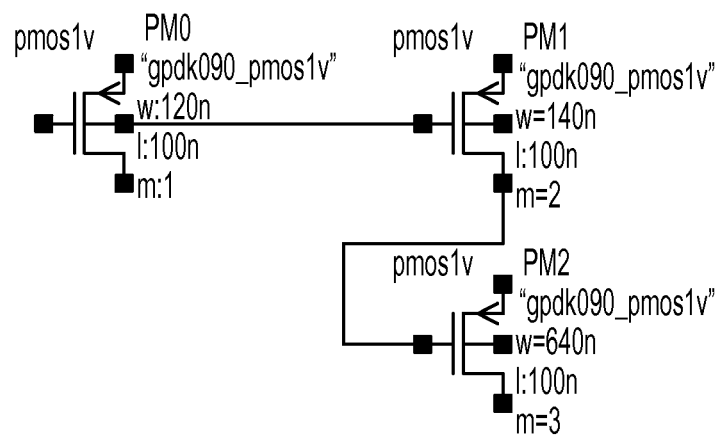
Figure 8A:
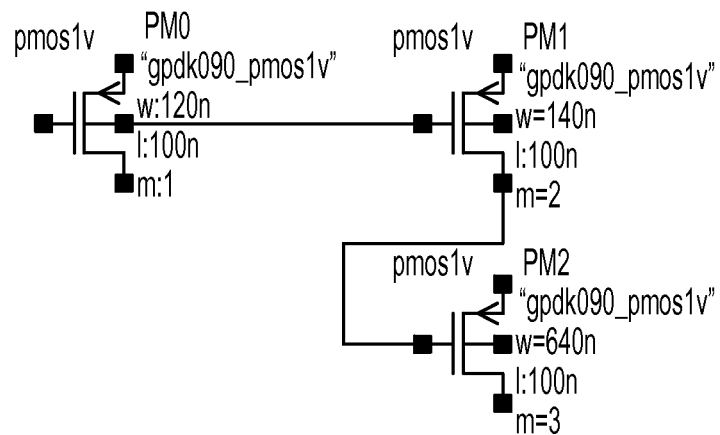
Figure 8B:
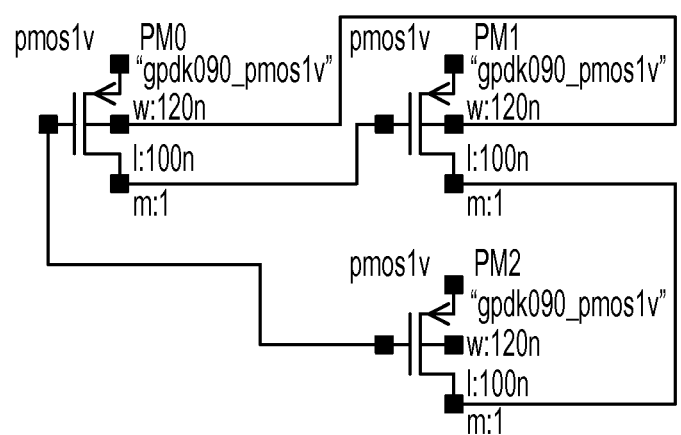

In still another example situation, there are typically many devices in a layout in which a drain and source of a transistor are shared, but the designer needs to search only for those devices which have three gates and the inter-gate distance is X microns (FIG. 5A). As shown in the corrected design of FIG. 5B, the designer needs to increase the distance between the three gates by M microns and increase the active length at the right end by N microns; and the left-most gate should not be moved. Furthermore, this task has to be done for many different instances of devices in the design. In another example task shown in FIGS. 6A and 6B, a designer wants to move a via by an amount X in a horizontal direction and an amount Y in a vertical direction because the via was slightly misaligned during routing. FIG. 6a shows the original feature and FIG. 6b the corrected feature. In still another example task, a designer wants to search for the specific schematic structure (topology) shown in FIG. 7a and change the device parameters to those shown in FIG. 7b. In yet another example task, the designer wants to change the interconnection of three transistors in the basic bit-cell block structure shown in FIG. 8a to the connection shown in FIG. 8b, and wants to do this everywhere in the design that this bit-cell block occurs.

Further examples of similar editing and correction tasks include: adding a shape (e.g. of a specific layer and dimension) or an object at a specific distance from another specific shape; deleting a specific shape or object having a certain property specification; moving a shape or specific layer and dimension; modifying spacing between two specific shapes; modifying a specific spatial arrangement of shapes; modifying the connections between different layers or devices; reducing the dimensions of a specific shape; introducing specific-sized slots whenever the metal line width is more than a specific threshold; changing the width/length (W/L) of transistors that match specified criteria.

The present invention can perform any and all of the above editing and correction tasks using a graphical approach easily performed by users in a fraction of the time performing the tasks manually. This eases the burden on designers, who would otherwise have to spend a lot of productive time working on repetitive tasks, performing the same operations for each instance of many structures or other graphical objects in a design.

The present invention provides an intelligent search and replace mechanism that addresses all the cases related to repetitive edit, correction, and replacement. Thus a user can search for a specific graphical pattern (and other characteristics) in the design and then replace one or more found instances corresponding to the pattern by a "corrected" pattern. This approach allows the user to add, delete, move, copy, or otherwise manipulate all devices or shapes in the schematic or layout design. Any custom and repetitive edits, corrections, or design modifications are possible in an automated fashion from a graphical user interface (GUI), without the need for any programming.

Thus the present inventions fulfills the needs of designers by providing a search and replacement mechanism in both schematic and layout designs; supporting structural, logical, and property-based matches, on user-defined patterns for multiple occurrences in the design, without any need to write programs or scripts in any language. The replacement mechanism of the inventions is intelligent and flexible enough to cover design modification (due to design intent change), design correction, optimization, and general replacement. Furthermore, the inventions address common situations in design. These common situations include changes in design intent, i.e. changes in the design itself, either electrically or logically, and design correction and optimization, e.g., correcting a mistake in the design or performing customized optimization.

The two main components of the invention include a search operation for user-defined patterns in schematic and layout designs, and "smart" replacement of found instances in the designs with a user-defined pattern.

The search component allows a user to graphically draw or otherwise graphically define a pattern for search. The "pattern" to be searched is a user-defined graphical object, that is similar in characteristics to existing graphical objects in the applicable design. As a graphical object, it is intended for display on a display screen when viewing the design. For example, for a layout design, the search pattern can be a layout structure such as one or more traces, shapes, vias, or other layout objects. For a schematic design, the search pattern can be a schematic object, such as a transistor device or a portion of a circuit. The pattern is a graphical object, which can be a single device or structure, or can be a collection of devices/structures, a sub-circuit, or other portion of a design.

In some cases, the user can draw a search pattern from scratch in a graphical interface, in the same way the user creates objects for the design normally using the graphical design application. In other cases, the user can copy and paste a graphical object from an existing graphical design into the interface to use the copied object as a pattern. The user may also optionally modify the copied pattern using standard graphical design application features.

If the search pattern is a schematic pattern for use in a schematic design, then the pattern can be an object including one or more combinations of devices with specific interconnection, and can involve hierarchy as well. Any constraints in the design can also be included in the search pattern. The user can further specify characteristics of the search pattern object that must match instances in the search, and which characteristics are "don't care." This allows a search tolerance in the property-based search. If the search pattern is a layout pattern, then the pattern can be an object that is a single pattern for one shape on a single layer, or is a composite, consisting of multiple layers and/or multiple shapes. Further, search tolerance can be specified in the pattern using mechanisms that include edge-based tolerance. Constraints provided on the searched shapes and objects can also be included in the pattern.

After specifying the search pattern, the user can define the search parameters, and the search is performed by the system. The user can then view the resulting instances of the design that matched the search pattern. The instance is a matching graphical object which corresponds to the one or more devices, connections, structures, and/or characteristics of the search pattern.

Another component of the invention is "smart" replacement of matching object instances in the design with user-defined replacement patterns in both schematic and layout designs. In embodiments having this component, the user can graphically draw or otherwise graphically specify a replacement pattern that is a graphical object suited to the applicable type of design (e.g., schematic or layout design). Similar to the search component, the user can draw a replacement pattern from scratch in the usual way when using the graphical design application, or can copy and paste a graphical object from an existing graphical design and optionally modify the copied object using standard graphical design application features.

If the replacement pattern is a schematic pattern for use in a schematic design, then the structure can be a single device, or a combination of devices with specific interconnections, including hierarchy if desired. Structure, logic, and properties of the design instance can be replaced with those of the replacement structure, thus providing a structural, logical, hierarchical, and property-based replacement mechanism. If the replacement pattern is a layout replacement structure, the pattern can be simple or composite similarly to the search pattern as described above.

The user can also define replacement parameters and perform smart replacement. Additional features include simultaneous view support for controlling relative spatial displacement of replaced and replacement objects, connectivity-aware intelligent replacement, connectivity-aware auto-replacement between schematic and layout designs, replacement of constraints between search and replacement patterns, control over scope of replacement, support of hierarchical replacement, performance of replacements simultaneously on multiple cell views, and a comparator of replace results. Details of these features are described below.

To more particularly describe the features of the present invention, please refer to FIGS. 9-27 in conjunction with the discussion below.

Figure 9:
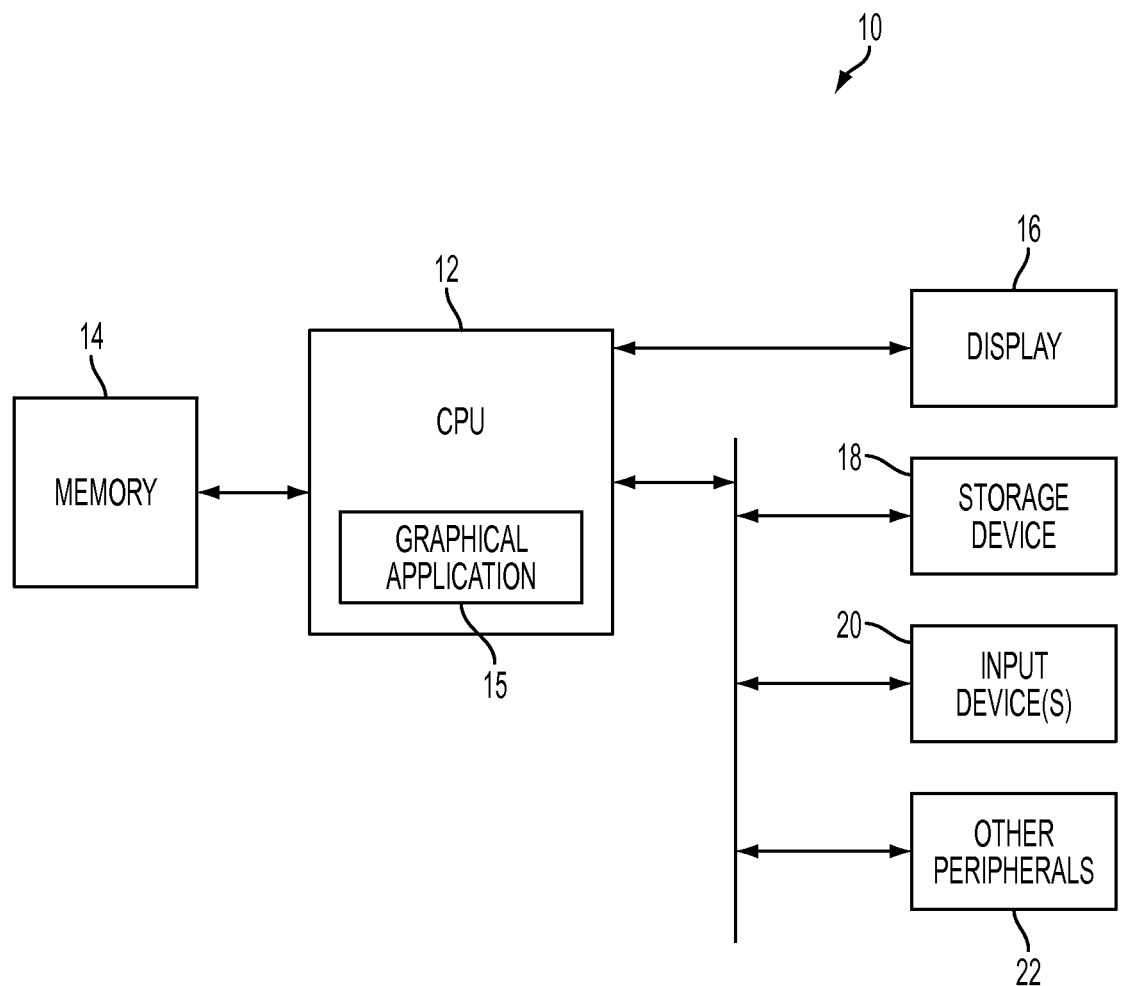
FIG. 9 is a block diagram illustrating a system suitable for use with the present invention.

FIG. 9 is a block diagram illustrating a system 10 suitable for use with the present invention. System 10 can be any suitable computer system, server, or other electronic or hardware device. For example, the system 10 can be a mainframe computer, desktop computer, workstation, portable computer, or electronic device (set-top box, portable device, cell phone, personal digital assistant, media player, game device, etc.). System 10 includes a CPU 12, memory 14, display device 16, storage device 18, input device(s) 20, and other peripherals 22.

CPU 12 can be one or more microprocessors or other processors to execute program code and control basic operations of the system 10, including processing operations, manipulating data, issuing commands to other components of the system 10, etc. For example, an operating system can run on the system 10 and is implemented by the microprocessor 20 and other components of the system 10. CPU 12 can also implement graphical design application software 15 of the present invention, as described further below.

Memory 14 is typically provided in system 10 for access by the CPU 12, and can include one or more of a variety of types, such as random access memory (RAM), read-only memory (ROM), Electrical Erasable Read-only Memory (EEPROM), Flash memory, etc.

Display device 16 outputs displayed images to a user of the system 10. Display device 16 can be any of a variety of types of displays, including LCD, LED, Plasma, CRT, etc. Some implementations of the display device 16 include a screen having a screen size, e.g., an area within which images are displayed. Storage device 18 can store data that may be retrieved by the CPU (including program instructions and/or data for graphical design software 15), and can be any of a variety of devices such as a hard disk, CD-ROM, DVD-ROM, Blu-Ray disc, magnetic tape, etc. Input devices 20 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 22 can include any other devices connected to and used by the system 10, such as any peripheral, card, or interface device that performs one or more functions and communicates with the system 10, such as network adapters that enable the system 10 to become coupled to other computer systems or devices through intervening private or public networks, scanners, printers, sensors, speakers, etc. In the example of FIG. 1, the display device 16 is connected to the CPU 12 by its own dedicated bus, while storage device 18, input devices 20, and other peripherals 22 are connected to a common bus that is also connected to the CPU. In other embodiments, the display device 16 and other devices can each have their own bus, or share one or more common buses. One or more of the buses or other links can be implemented using wires or wirelessly, according to any of well known standards and protocols.

The graphical design application 15 and interfaces of the present inventions can be implemented by the CPU 12 to display one or more images and/or interface on the display device 16 and receive input from one or more of the input devices 20 to control the functions of the application and interface. The software 15 can also be stored on storage device 18 and/or in memory 14. The functionality of software 15 is described in greater detail below.

Search Component

Figure 10:
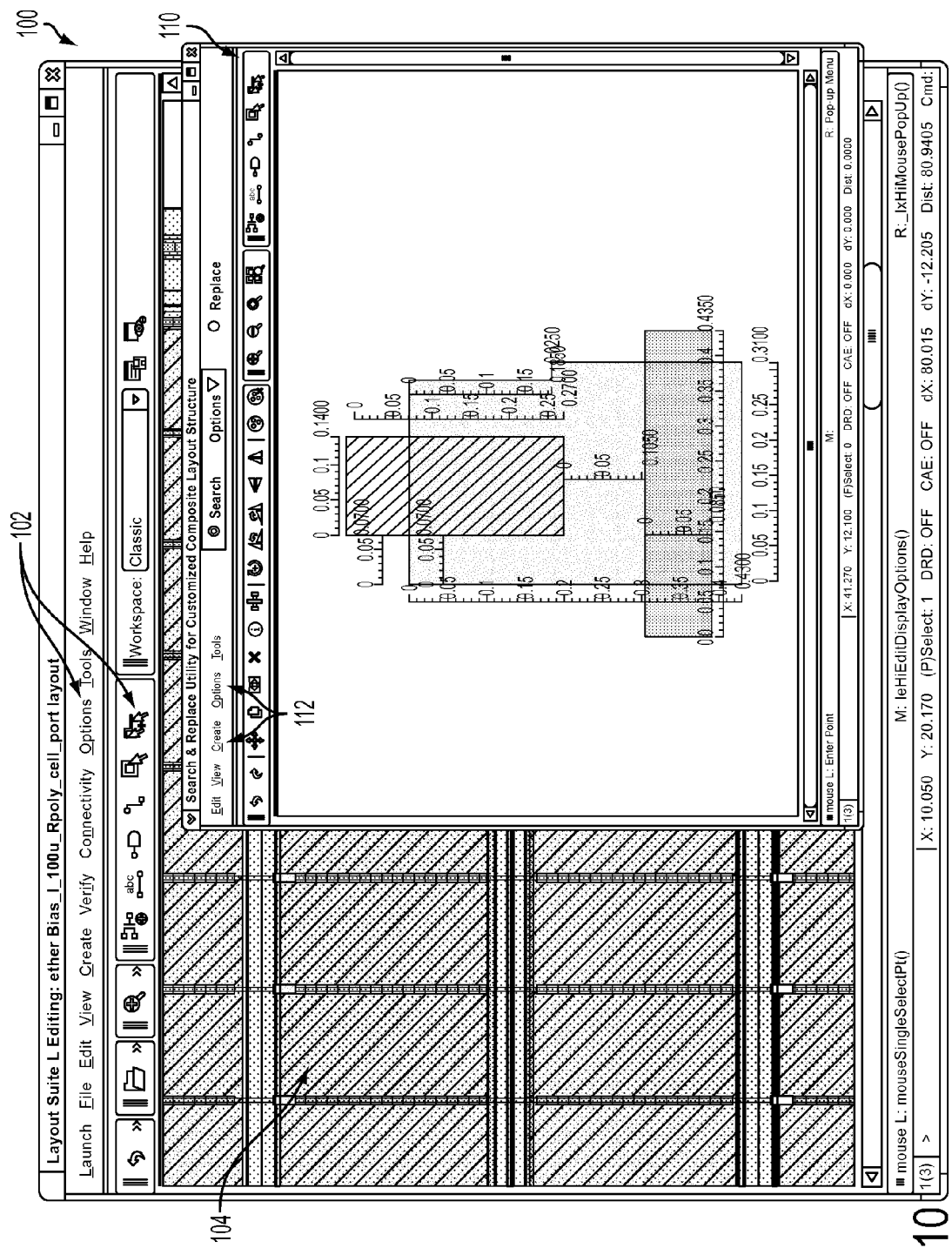
FIG. 10 is a diagrammatic illustration of an example embodiment of a graphical search interface of the present inventions.

FIG. 10 is a diagrammatic illustration of one example of an interface 100 for a graphical design application 15, from which a search graphical user interface (GUI) 110 of the present invention is invoked and displayed. This example is an illustration of interfaces for use with a layout design. A similar GUI appropriate for a schematic design can also be provided. The graphical interfaces are displayed within a predefined viewing area of the display device, the predefined viewing area being bounded by a screen size of a screen of the display device 16.

Design application interface 100 includes a displayed interface and image. The interface is shown as a displayed window within a graphical user interface, but can be displayed in other forms in other interfaces. In the displayed interface 100, various controls 102 are displayed such as menu items and buttons which allow the user to select various viewing and editing functions of the application and interface 100. The interface 100 also displays a main image 104 which is created and/or edited by the user with functions of the interface 100. The image 104 displayed in the interface 100 can be part of a complete, larger image or design "canvas" (a complete set of data for the design) that is stored in the memory 14 or other data storage of the system 10, where only part of the complete canvas is displayed in the interface 100 at one time. Alternatively, or at other zoom levels, the image 104 can be the complete canvas.

In the example embodiment shown, a layout design application is being used on system 10 and provides the interface 100. This application allows designers to create and edit layout designs for integrated circuits, circuit boards, or other electronic designs (and may have many other functions, not detailed here). For example, the layout design application of interface 100 displays an image 104 which can be the entire canvas for the layout design (i.e., the entire layout design) or only a part of the canvas, and which depicts an integrated circuit layout having transistors, electrical traces, vias for connecting different layers, and/or other electronic components. The user can create, add, delete, or modify the component images in the image 104 using controls 102 and/or other input and commands, which in some embodiments can modify an underlying data model of these components that corresponds to the displayed images that incorporates functionality and connectivity of the components of the design (e.g., a design that is "connectivity-aware"). The interface 100 and editing application provide well-known viewing and editing functions to allow the user to create and edit the components and layout of the layout image 104. Other embodiments may allow varying degrees of automation in the planning and/or layout tasks.

Search interface 110 provides search capabilities of the present invention. Search interface 110 can be invoked by a user using a menu, inputting a command, or selecting another selectable option in the design application interface 100. The search interface 110 can be a fully-fledged editor window that, in some embodiments as shown, can be displayed on top of the main window of the interface 100 of the graphical design application. In other embodiments, the search interface 110 can be displayed in other locations of the display screen 16. In some embodiments, all of the command-key bindings and settings of the graphical design application interface 100 are also active in the search interface 110. Menu items 112, however, can be specific to the search function in interface 110.

Within search interface 110, users are able design and define the exact schematic or layout pattern for which they want to search the design. The specified search pattern is a graphical object that can comprise one or more components of a design, e.g., schematic devices and their interconnections or layout shapes on multiple layers (composite shape). Users are also able to copy schematic or layout components from the main design canvas or image 104 of the graphical design application interface 100 and paste it in the interface 110, and vice-versa. This allows the user to perform a simple copy and paste operation once the user has identified a component, such as occurrences of a layout structure the user wants to search in the entire cell or canvas view. This saves time in specifying the search pattern in the search interface 110. Furthermore, once the search pattern has been pasted into search interface 110, the user can make edits or changes to the search pattern using standard editing features that are available in the interface 110. For example, the user can change the size, shape, location, layer, or other graphical characteristic of the search pattern.

In some embodiments, when the search interface 110 is active, a layer selection window of the graphical design application is tied with the interface 110. The layer selection window (not shown) is a separate window provided in some embodiments to allow the user to select the active layers that are displayed in an interface, and/or validate selected layers. This layer selection window can be used with the search interface 110 of the present invention to select visible layers for defining of search patterns.

Figure 11:
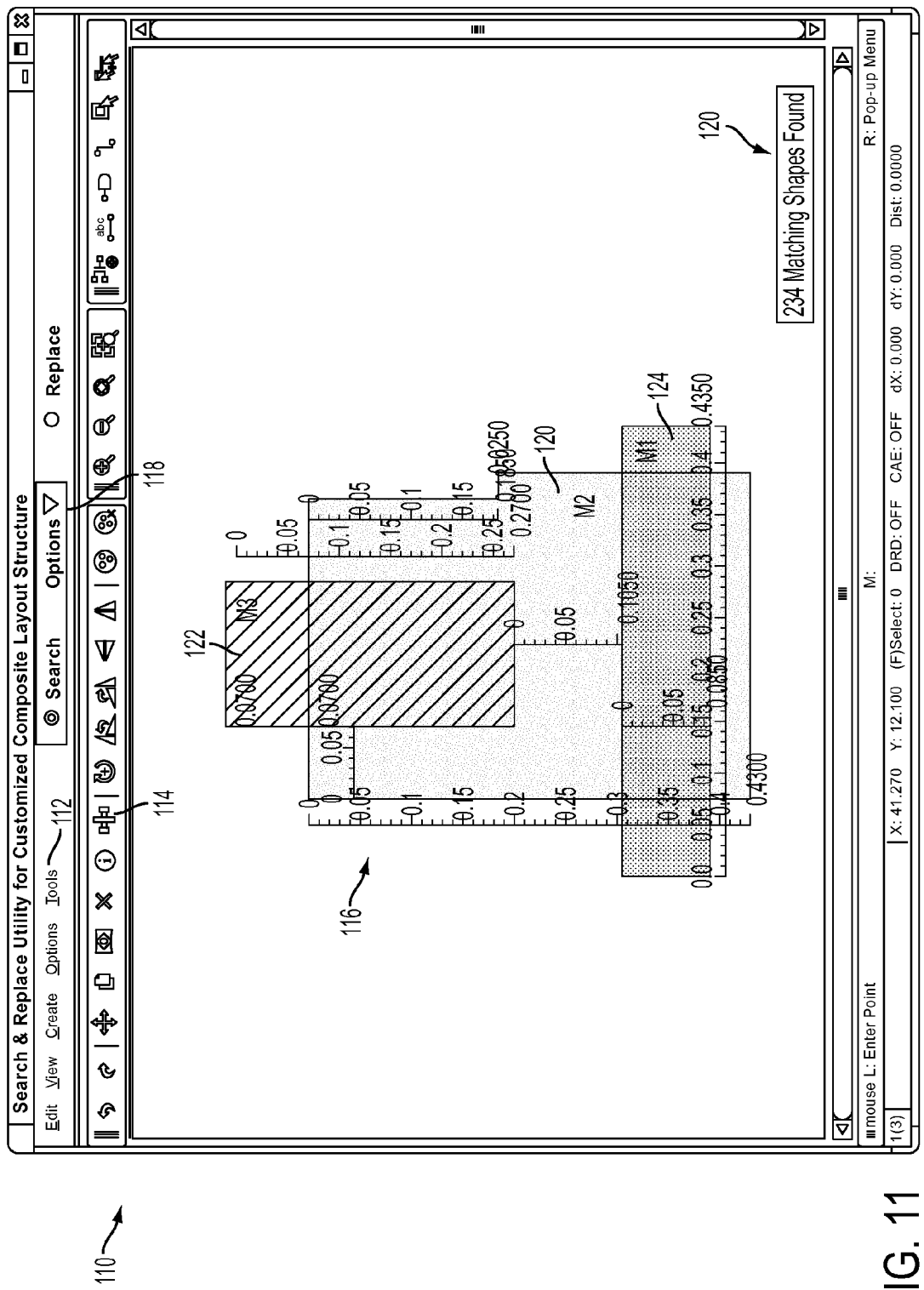
FIG. 11 is a diagrammatic illustration of a more detailed view of the graphical search interface of FIG. 10.

FIG. 11 is a more detailed view of the example search interface 110 of the present invention shown in FIG. 10. The search interface 110 can include a reduced menu 112 and toolbar 114 compared to the interface 100, to make the options more relevant to the search function. A graphical search pattern 116 can be created (e.g. drawn or otherwise created with graphical tools and options), copied, and/or edited just like in the interface 100, using the same tools, options, and functions that are available in the interface 100. A search mode and options menu 118 can allow the user to select often-used options within the search interface, and is described in greater detail below with respect to FIGS. 16 and 17. A search status 120 can be displayed in the interface 110 to show the result of a search operation that has been performed. For example, in the embodiment of FIG. 11, the search status 120 indicates the number of instances in the layout design that match the search pattern 116. Additional status information can be displayed in other embodiments.

For example, in the layout search pattern example of FIG. 11, the user is searching for a composite structure 116, for any number of occurrences of this same structure in the layout design. The structure 116 includes a shape 120 labelled M2, having a notch in the upper right corner. A shape 122 labelled M3 and a shape 124 labelled M1 are partially overlapping the shape M2.

The user is able to also specify search parameters to narrow search conditions. These parameters can include some of the options as described below with respect to FIG. 16. The parameters also can include specifying characteristics of the search pattern that must be included in object instances in the design for those instances to be considered a match. The user can input these characteristics via the graphical interface, using graphical drawing tools if the characteristic is graphical (e.g. structural, logical or property characteristics) or by inputting symbolic or text information using forms and entry fields, directly entering the values in the GUI, or other method if the characteristic is not graphical.

The search pattern characteristics can include structural characteristics, which include the physical/graphical dimensions of an object such as a layout structure (these characteristics are not as relevant to schematic objects). The characteristics can also include logical characteristics, such as hierarchy. For example, the user can specify a search pattern that specifies the searched pattern must be within a module C, which is within a module B, which is within a module A. Thus if an object is missing any of this specified hierarchy, it does not match. Other logical properties can also be specified in the search pattern to match logic of an object.

The characteristics can also include connectivity characteristics, which describe a set of devices or other objects connected with each other in a certain manner or in a particular configuration, e.g., with particular electrical connections, trace connections, etc. The connectivity search characteristic specifies these particular devices connected in this particular configuration. Both the devices and the configuration or interconnection of these devices can be specified in a connectivity characteristic. For example, to narrow down a search, the user can provide connectivity information in the search criteria, such as specifying that a searched shape should have net connectivity "A" or "B" only, and otherwise there is no match even if structural criteria matches. In such a case the search will match not only structural dimensions but also connectivity information.

The characteristics can also include property-based characteristics, which are the associated properties or associated values of a searched object, such as resistance, capacitance or other electrical properties, a type of device (p-cell, n-cell, etc.), name identifier, magnification factor, multiplication factor, finger factor, poly end-cap properties, etc. In some embodiments, property-based characteristics can also include hierarchy characteristics, indicating the hierarchical level of the design in which the object is located. The user can specify property information in the search, e.g., a shape should have property "x" having a certain "y" value, and shapes having any other value will not match.

In some embodiments, the user can define characteristics of the search pattern that should be matched, and can designate other characteristics as "Don't Care," i.e. characteristics which do not matter to the search criteria, and can be any value or attribute. This ability to define search characteristics and don't-care characteristics can be supported by regular expressions and wildcards. For example, there may be a property "x" having a value that the user does not care about; e.g., its value can be 0 microns or can be 1000 microns. But there is another property "y" whose value should be exactly 234 microns, and another property "z" whose value should 12 to 16 microns. There is also another set of properties called param_m_factor_PLL, param_m_factor_WLL, param_f_factor_Capacitor, which each should have a value of 19. So user can specify these criteria as the following:

x=don't care; y=234 micron; z=12-16 micron param_?_factor_*=19 where "?" is a wildcard that matches a single character, so it will match "m," and "f" of the 3 properties, and "*" is a wildcard that matches multiple characters, so it will match "PLL," "WLL," and "Capacitor."

The user can also define one or more constraints as characteristics for the search pattern 116 to search for these constraints, similar to the search characteristics described above. For example, a distance constraint can be specified, or any of the standard constraints implemented by available graphical design applications. Search pattern constraints can be included for any of the characteristics of a graphical object, including structural, logical, connectivity and property-based (including hierarchical) characteristics. Specified constraints would be searched for in instances of the design when the graphical pattern 116 is searched for, and only those instances in the layout design in which the graphical structure as well as the specified constraints (and the values of the constraints) are met, are considered to match the pattern 116.

The ability to search for constraints in conjunction with other search parameters such as structural dimensions, property-based characteristics, etc., is one important feature in particular embodiments of the invention. Furthermore, replacing a design topology with another topology, including constraint replacement, is a useful feature. For example, if there is a constraint between devices A and B, then not only can the user replace the set of devices A and B with another device set B and C, but also can replace the constraint between A and B by a different constraint between B and C.

The search function of the present invention can in some embodiments also include defining input conditions and tolerances. A simple search input form can allow the user to specify structural tolerances and hierarchy. In some embodiments a more advanced search form can be used, in which users can specify all these values for structure, connectivity, properties, etc. and define search criteria using logical operators like AND, OR, NOT, or other well known operators. For example, to define net A or B in a search condition, user can input "net=A (OR) B."

Figure 12A:
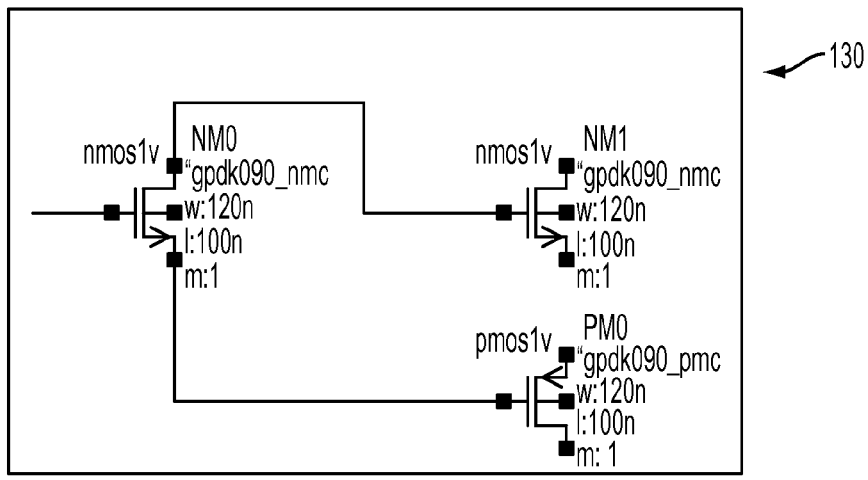
FIGS. 12A-12C are diagrammatic illustrations of a graphical schematic for illustrating schematic tolerance definition when defining a search pattern according to the present invention.
Figure 12B:
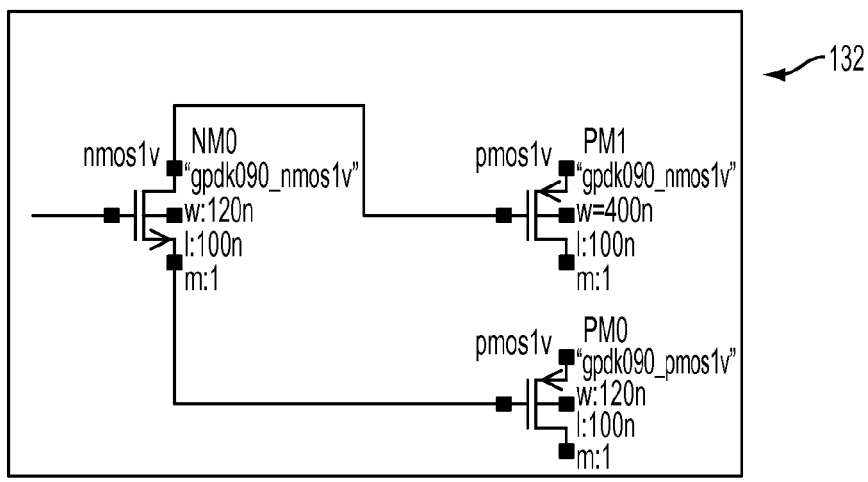
Figure 12C:
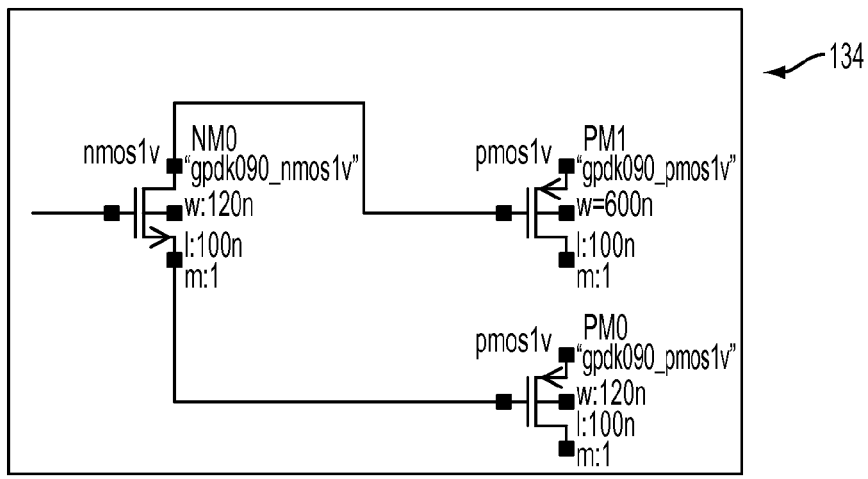

FIGS. 12A-12C are diagrammatic illustrations of a graphical schematic for illustrating schematic tolerance definition when defining a search pattern according to the present invention. In search interface 110, a user can specify tolerance for characteristics of the search pattern which gives more leeway to find matching instances in the design. For example, FIG. 12A shows a circuit portion 130 of a schematic design having an established connectivity, including the connections between devices and the values of the properties of the devices, such as width W.

In one example, the designer wishes to search to for circuit instances of the design in which a left side nmos1v (instance NM0) drain terminal is connected to the pmos1v (with M-factor 1 and W/L=120/100 n). Furthermore, the source terminal of NM0 can be connected to any pmos1v or nmos1v with a W ranging between 100 and 400 n and L=100 n. Using such a search pattern, the circuit portion 130 shown in FIG. 12A will match. In addition, the circuit portion 132 shown in FIG. 12B will also match, even though the source terminal of NM0 being connected to the pmosv1 device PM1 having a W of 400 n, since this value is within the specified tolerance range of 100 to 400 n. However, the circuit portion 134 shown in FIG. 12C will not match, because the pmosv1 device PM1 has a W of 600 n, which is outside the specified tolerance range of the search pattern.

Figure 13A:
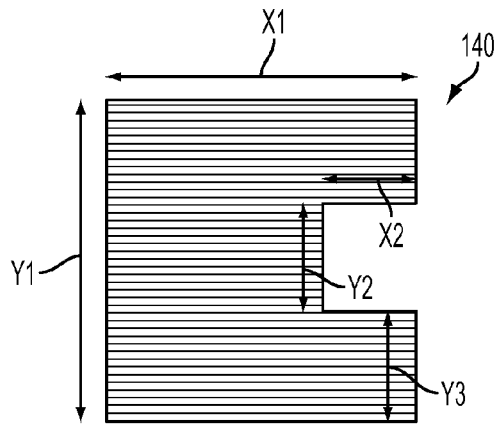
FIGS. 13A-13B are diagrammatic illustrations of layout structures for illustrating layout tolerance definition when defining a search pattern according to the present invention.
Figure 13B:
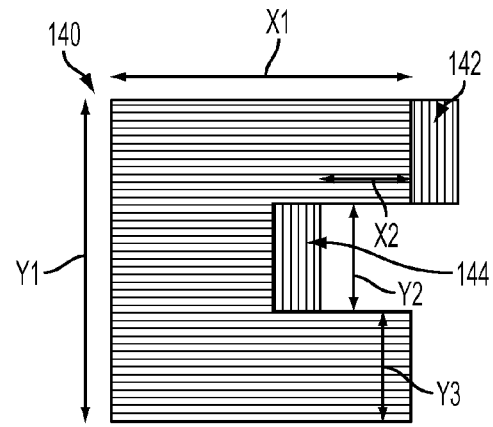

FIGS. 13A and 13B are diagrammatic illustrations of layout structures for illustrating layout tolerance definition when defining a search pattern according to the present invention. In search interface 110, a user can specify tolerance on the dimensions of layout structures of a design. For example, a layout search pattern can specify specific dimensions for the layout structures being searched. FIG. 13A shows specific X and Y dimensions for a layout structure 140 having a notch in its right side, where the user can specify this structure 140 as a search pattern having these particular dimensions to find all layout structures in the design having the specified dimensions.

However, the user may not want to match only structures having the exact dimensions of a search pattern, and may wish also to match layout structures having dimensions close to particular dimensions of the search pattern. In one example, 100 structures of the design match the specified search pattern 140 of FIG. 13A. However, there are another 200 structures in the design in which the only difference is X1 is 0.2 u more, and there are another 100 structures in the design in which the edge X2 is 0.1 u less, all of which the user wants included in the search results. Instead of performing multiple searches to find each of these structure variations, the user wants to search for all of them together in one search. For example, as shown in FIG. 13B, the user wishes to match the pattern 140 equal to that shown in FIG. 13A, and also wishes to match the additions 142 and 144 to the pattern 140. For such inexact searching, the user can define search tolerances for the appropriate dimensions of the pattern 140 that are equal to the portions 142 and 144.

Figure 14A:
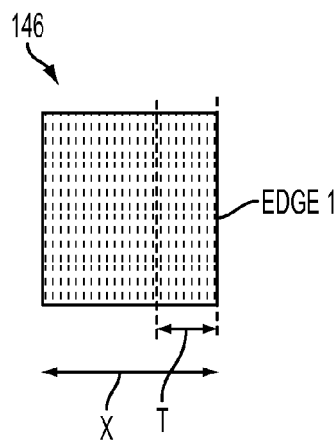
FIGS. 14A-14B are diagrammatic illustrations of search patterns including negative and positive tolerance parameters according to the present invention.
Figure 14B:
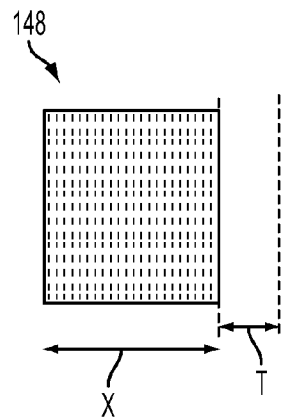

In some embodiments, the user is allowed the flexibility in search interface 110 to specify a tolerance range on a per-edge and per-layer basis. Since there can be overlapping edges in a layout design because of different layers, the tolerance range for each layer may be different. Furthermore, tolerance ranges can be specified as negative or positive. FIG. 14A is a diagrammatic illustration showing a search pattern 146 in which a negative tolerance T is defined. Layout structures can be searched with a specified tolerance range of widths between X and (X−T), i.e., Edge 1 of a matching structure in the design has a spatial location between X and (X−T). For example, in some embodiments, negative tolerances can be defined as toward a center of the associated structure, or alternatively always in a particular direction within the interface 110. Similarly, FIG. 14B illustrates a search pattern 148 in which a positive tolerance T is defined. Layout structures can be searched with a specified tolerance range of widths between X and (X+T), i.e., Edge 1 of a matching structure in the design has a spatial location between X and (X+T).

Figure 15:
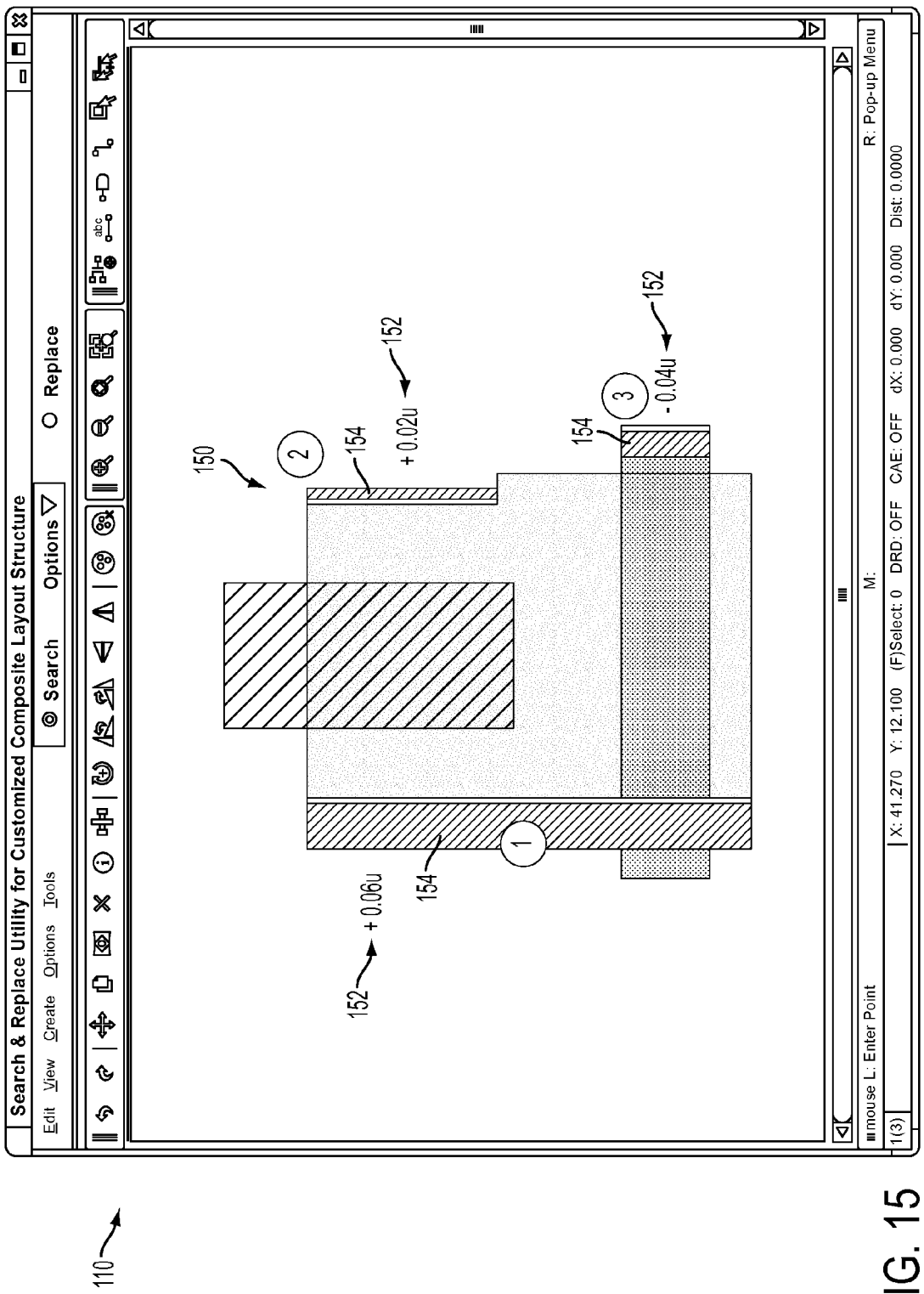
FIG. 15 is a diagrammatic illustration of the search interface of the present inventions illustrating tolerance specification for a displayed search pattern.

FIG. 15 is a diagrammatic illustration of the search interface 110 illustrating tolerance specification for a displayed layout search pattern 150. In some embodiments, the tolerance value 152 for a particular edge of the pattern 150 can be displayed next to the associated edge, to assist the user. For example, the tolerance value can be shown as a +/− value. Furthermore, the search interface 110 can internally number (or otherwise provide a different identifier for) each of the edges of a search pattern that have a tolerance specified, and can (if the user desires) display these numbers in the interface 110 next to or alongside their associated edges of the search pattern. For example, search pattern 150 in interface 110 has three edges specified with tolerances, which are numbered as edges 1, 2, and 3 and the numbers are displayed next to their associated edges. These numbers can also be reflected in the search options form, described in greater detail below with respect to FIG. 16). This numbering is provided for only those edges of a search pattern which have an associated tolerance defined. The internal numbering and its display in the interface 110 have the advantage that when there are overlapping edges in the search pattern from multiple structures of different layers (such as the three layers shown in FIG. 15), the numbers make it easier for the user to distinguish and select particular edges and perform editing and manipulation of the pattern. Furthermore, the user can cross-select between the options form 160 and the interface 110 and enter tolerance values for edge-layer values in the options form 160 (see FIG. 16).

In addition, the interface 110 can depict the value or range of a tolerance graphically to assist the user. For example, as shown in FIG. 15, each tolerance for edges 1, 2, and 3 is depicted by a shaded area 154 that is displayed next to the actual displayed edge of the pattern 150 and has a size equal to the range of dimensions in the tolerance range. The shaded areas can be displayed in a different color or otherwise be distinguished from the actual pattern. This makes it easier for the user to visually work with the tolerances.

Other embodiments can include tolerance specification for other dimensional properties of a search pattern besides a graphical edge, such as a location of a vertex or other property.

Figure 16:
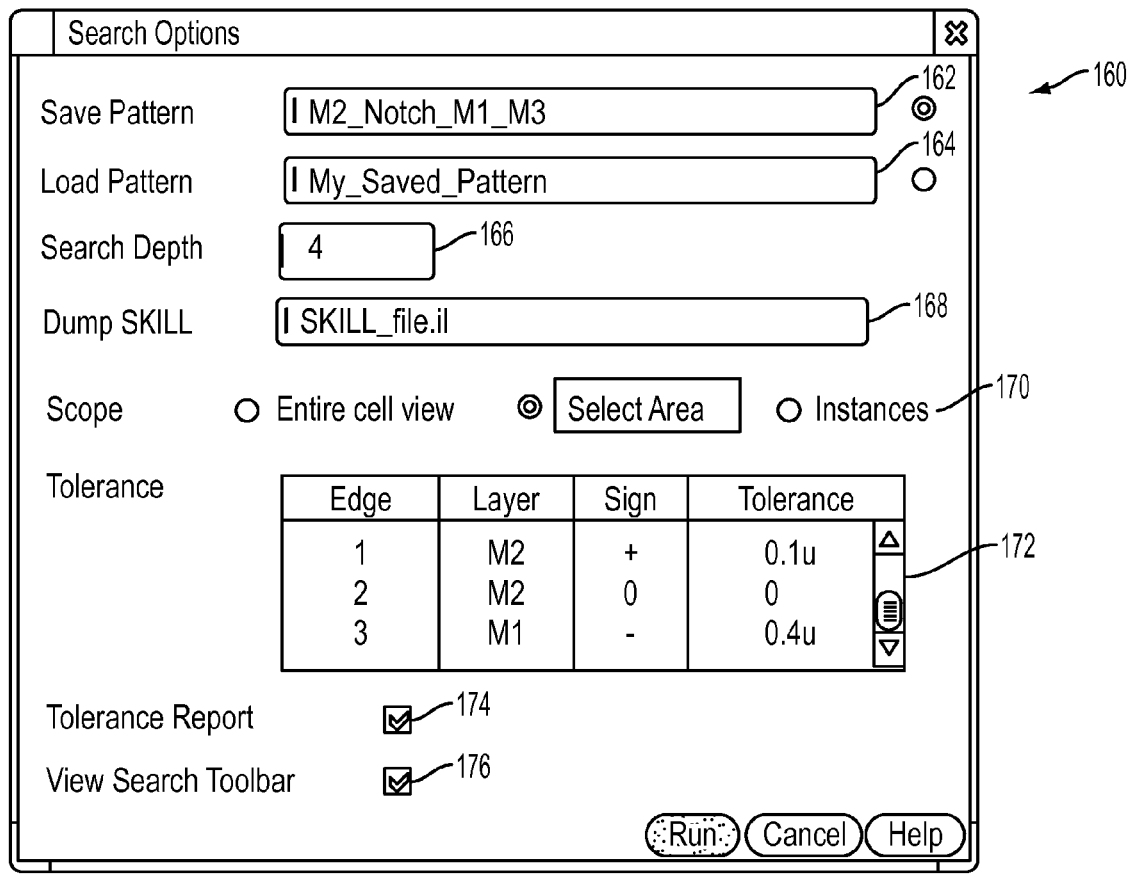
FIG. 16 is a diagrammatic illustration of an example of a search options form used with the search interface of the present invention.

FIG. 16 is a diagrammatic illustration of an example 160 of a search options form used with the search interface 110 of the present invention. Search options form 160 can be displayed as a separate dialog box or window from search interface 110 when an appropriate command is input by the user. Alternatively, the options form 160 can be displayed within the interface 110. In the embodiment of FIG. 11, for example, form 160 can be invoked by the user selecting the search option selection 118, or by a menu command or hotkey command.

Form 160 includes several options for the user to manipulate the search pattern 150 in the interface 110. Input field 162 allows the user to save the search pattern 150 by inputting an identifier for the search pattern 150, such as a filename to refer to the stored search pattern that has been saved to a storage device (e.g., storage device 18). In a load field 164, a saved pattern can be specified by the user by inputting its identifier and loaded into the interface 110, to then be modified and/or used as the basis of a search. Saving and loading options are important in the present invention since users can define complex search patterns. A search depth field 166 allows the user to specify a particular hierarchy level, or range of hierarchy levels, of the design in which the search operation will applicable, where hierarchy levels outside the specified level or range will be ignored in the search operation. A dump SKILL field 168 allows a user to dump SKILL code (or code of a different programming language in other embodiments) that describes the search pattern 150 defined in the interface 110, and store the skill code separately. This allows further reuse of the search pattern that has been created for other uses, e.g., script-related tasks.

The scope field 170 allows the user to specify different portions of the design to which the search operations will be limited. For example, the user can select whether the search operation for the specified search pattern 150 will be performed for the entire design (e.g. cell view), a specific area of the canvas, or specific instances of structures or portions of the design. If the user selects a specific area, then the "select area" button can be selected, followed by drawing a box or other selection within the interface 110 on the main canvas to indicate the desired area. If specific instances are selected, the user can then select particular instances in the design by selecting the instances in the interface 110. In addition, the user can search for rotated instances of the specified pattern.

The tolerance table 172 defines the tolerance values for each edge of the layout structure that has been defined in the search interface 110 as described above. Each edge has a numerical identifier and the table indicates the layer, sign (negative or positive), and the magnitude of the tolerance. A tolerance report can be selected for output with option 174, which causes a tolerance report to be generated, in which classification of searched structures are listed based on tolerance range. In one example, if edge #3 on M1 has a tolerance of −0.4 u, such that the search matches shapes which have edge #3 located between the pattern's edge and −0.4 u, then the tolerance report can specify 27 matches for the pattern as drawn, 12 matches for −0.1 u, zero matches for −0.2 u, 67 matches for −0.3 u, and 23 matches for −0.4 u. The step size of categories in the tolerance report can be configured by the user. This report helps the user to fine tune the search parameters and tolerance. This allows the search results to be very specific to the user's needs, as may be desirable when using replacement of matched instances as described below.

A view search toolbar option 176 can be selected by the user to display a toolbar (or other displayed feature such as a window or dialog box) to view the search results. This is described below with respect to FIG. 17.

Figure 17:
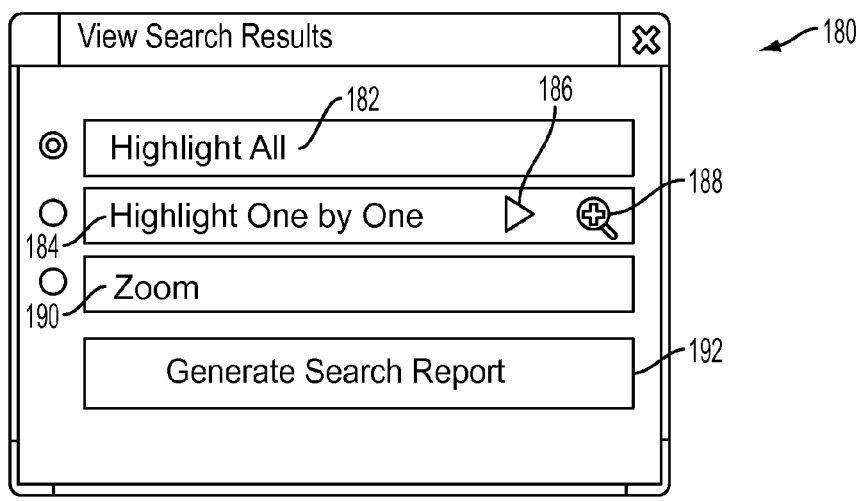
FIG. 17 is a diagrammatic illustration of an example of a view search results toolbar used with the search interface and search options form of the present invention.

FIG. 17 is a diagrammatic illustration of an example 180 of a view search results toolbar used with the search interface 110 and search options form 160 of the present invention. View search results toolbar 180 can be displayed as a separate toolbar, dialog box or window from search interface 110 when invoked by selection 176 in the search options form 160 of FIG. 16, or otherwise invoked by an appropriate command input by the user. Alternatively, the view toolbar 180 can be displayed within the interface 110. After (or during) a search operation, the view toolbar 180 allows the user to view all the instances in the design that matched the search pattern, and can allow the user to cycle through the search results in detail.

Toolbar 180 can include several options for the user to view the search results from a search operation, examples of which are shown in FIG. 17. The Highlight All option 182 allows the user to highlight all the searched instances as a selected set in the main layout canvas. From a high zoom level (i.e. high "altitude") in the interface 110, all the matching instances of the design are displayed. This option may be more suitable for use with smaller designs. The Highlight One by One option 184 allows the user to highlight one matching instance at a time in the main layout canvas, and by selecting the "Next" button 186 can shift the highlight cursor from one matching instance to another matching instance in the main layout canvas in interface 110. For example, the user can view the canvas at a high altitude and view the search results one by one. Furthermore, when highlighting one instance at a time from a high altitude, the user can zoom into the instance or a corresponding area of the canvas for a closer displayed view. In some embodiments, the user can achieve this greater zoom by selecting the zoom icon 188. Selecting the "Next" button 186 can in some embodiments again take user back to the higher altitude.

The Zoom option 190 allows the user to select a mode in which the user is always zoomed into the viewed search result, and selecting the "Next" button 186 changes the view to the next search result at the zoomed-in level, and so on. Thus the view would always be in a zoom mode having a closer view of a matched instance.

The Generate Search Report option 192, when selected, creates a text report of the search results including the matching instance(s) and specified properties. For example, the report can include location coordinates and layers in which the matched instances are located. If the tolerance report option 174 was selected in the options form 160, then a tabular report is generated based on the tolerances as explained above.

The search results view can also provide a searched pattern browser, in which searching is by coordinate assignment. For example, the user can input a range of spatial coordinates to specify a particular area or portion of the design within those coordinates, and the searched results are performed in the specified area and displayed. The user may also or alternatively input a specific spatial coordinate which causes the results of the search to be displayed at the specified location of the design.

Replacement Component

Figure 18:
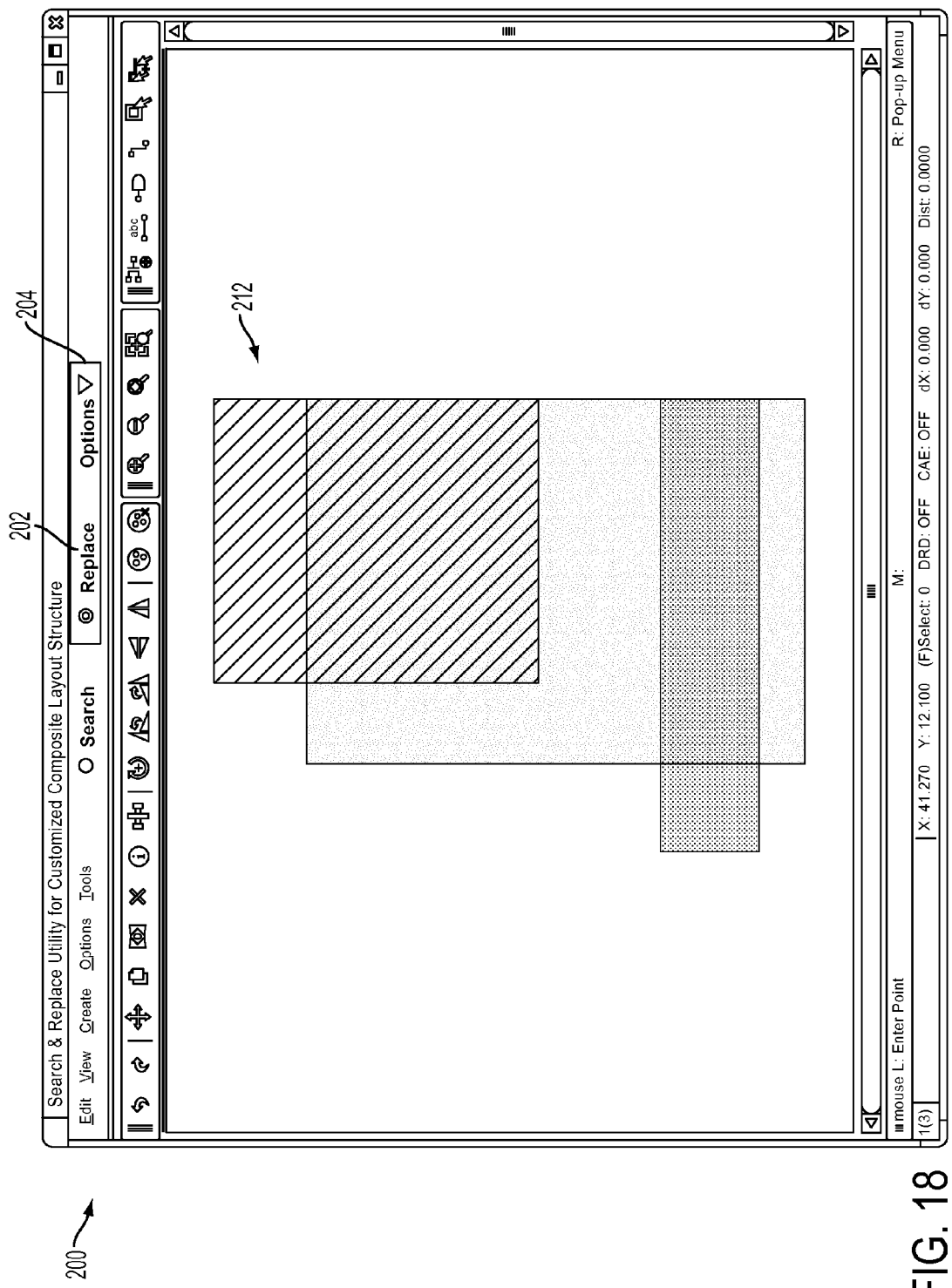
FIG. 18 is a diagrammatic illustration of one example of a replace interface of the present inventions, which allows a user to replace instances in a design with a replacement pattern defined by the user.

FIG. 18 is a diagrammatic illustration of one example of a replace interface 200 of the present inventions, which allows a user to replace instances in a design with a replacement pattern defined by the user. It should be noted that in some embodiments, the "replace" operation may include an internal search operation, such that once the user has specified a search pattern the user does not need to explicitly command to search for instances before initiating the replace operation. When the user invokes the replace operation, the user can be prompted to define the pattern to replace (the search pattern) in the search interface 110 (called from within the replace interface). Within the same replace interface environment, the user also can define the replacement pattern. When the user runs a "replace" operation, the replacement operation of the design application automatically searches and then replaces every matching instance of the searched pattern with the new replacement pattern.

The replace interface 200 of the present invention in some embodiments as shown, can be displayed on top of the main canvas of the interface 100 of the graphical design application, or alternately in a side window. The replace interface 200 is a complete editor in itself, for layout or schematic designs; a layout application is described below for explanatory purposes. Thus, all bind-keys and settings of the design interface 100 are also enabled in this interface 200. However, menu items are reduced to only those which are required to create a replacement pattern, and menu items which are irrelevant for this interface are removed. In some embodiments, all of the command-key bindings and settings of the graphical design application interface 100 are also active in the replace interface 200.

Users are able to design and define the exact replacement pattern which they want to use to replace the instances that match the search pattern. The replacement pattern can be defined using similar specified characteristics as the search pattern described above. In general, the matched instances being replaced (in any number of occurrences in the design) is referred to as the "old object" and the replacement pattern object is referred to as the "replacement pattern" or "new object" (for any type of design, such as both schematic and layout types of designs). The specified replacement pattern is a graphical object that can include one or more schematic devices and their interconnections, or layout shapes on multiple layers. Users are able to copy schematic/layout objects from the main graphical design application 100 canvas and paste them in the interface 200, and vice versa. In this way, the user can quickly design a new object as a replacement pattern which can replace all the desired occurrences in the design. Furthermore, after the object has been pasted into the interface 200, a user can make more edits to it. In some embodiments, when the interface 200 window is active, then a separate layer selection window of the graphical design application is tied with the interface 200, similarly as with interface 110 as described above.

FIG. 18 shows replace interface 200 displaying a replacement pattern, which in this example is a layout structure including multiple layers. Replace interface 200 can be invoked in any appropriate fashion, e.g., by a user using a menu, inputting a command, or selecting another selectable option in the design application interface 100. For example, the user can select the "Replace" radio button 202 in the menu bar of search interface 110, which causes the menu items and controls for the replace interface 200 to be displayed instead of the menus and controls of the search interface. (In some embodiments a different radio button for selection is displayed as "Search" which would cause the search interface 110 to be displayed.) In the described embodiment, most of the menu items and buttons are the same in the replace interface 200 as in the search interface 110 except for the option control 204 associated with each type of interface, and thus the interfaces 110 and 200 can be considered a single search and replace interface. However, in other embodiments the interfaces can be separate with different controls displayed in each interface. The replace interface 200 allows a user to create and/or edit a replacement pattern 212 which is a graphical object that can replace a graphical object instance in the design that was matched to a search pattern and found based on a searching operation.

Figure 19:
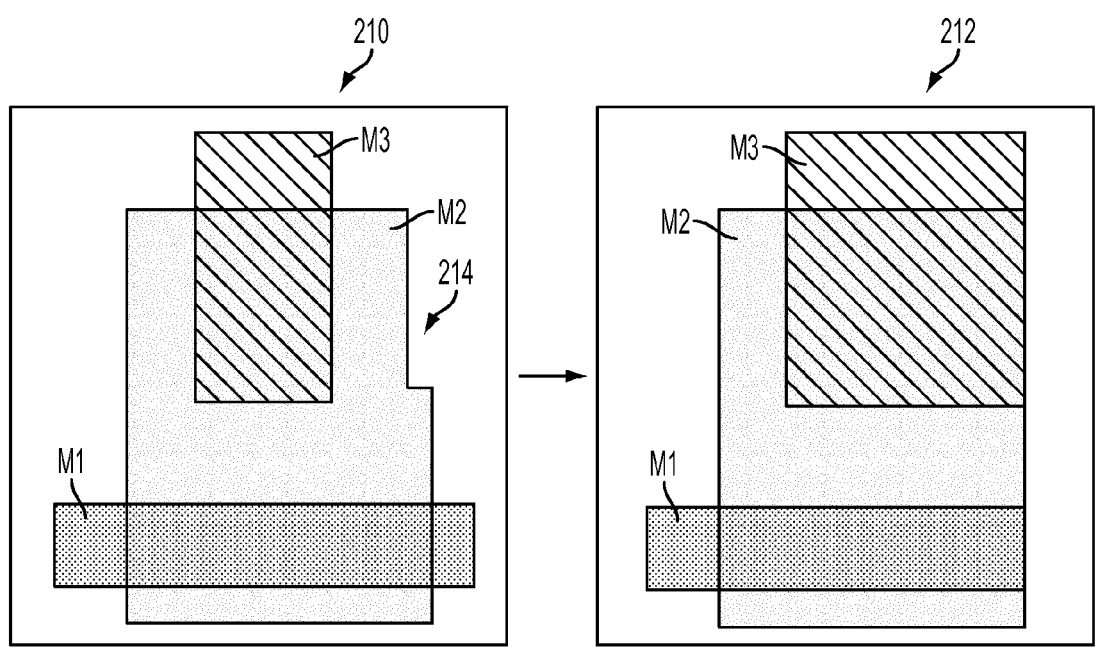
FIG. 19 is a diagrammatic illustration of an existing structure of a layout design that will be replaced with the replacement pattern that is a new structure.

FIG. 19 is a diagrammatic illustration of an existing structure 210 of a layout design that will be replaced with the replacement pattern 212 that is a new structure. A similar procedure can be performed for a schematic object in a schematic design. In the replacement pattern, the notch 214 on the right side of the layer M2 has been removed. Furthermore, the layer M3 has been expanded to align its right side with the layer M2. Furthermore, a part at the right of the layer M1 has been removed. This causes all three layers to be aligned at their right edges.

The user is thus able to correct a feature (the notch) as well as align all the shapes of different layers in a composite shape including layers M1, M2, and M3, and moreover, is able to make these exact changes in every instance of this layout structure in the layout design, without writing a single line of program code.

The user can input parameters to define the replacement pattern, such as one or more specified characteristics and values for the specified characteristics. The characteristics can include structural characteristics, logical characteristics, property-based characteristics, hierarchical characteristics, constraint characteristics, connectivity characteristics, etc., similarly as described above for the search pattern. For example, when a match to connectivity characteristics specified in a search pattern is found, the entire configuration can be replaced by a replacement connectivity configuration specified by the user in the replacement pattern, allowing the devices and their connectivity to be replaced by the same (or a different) set of devices having the same (or a different) connectivity.

Figure 20:
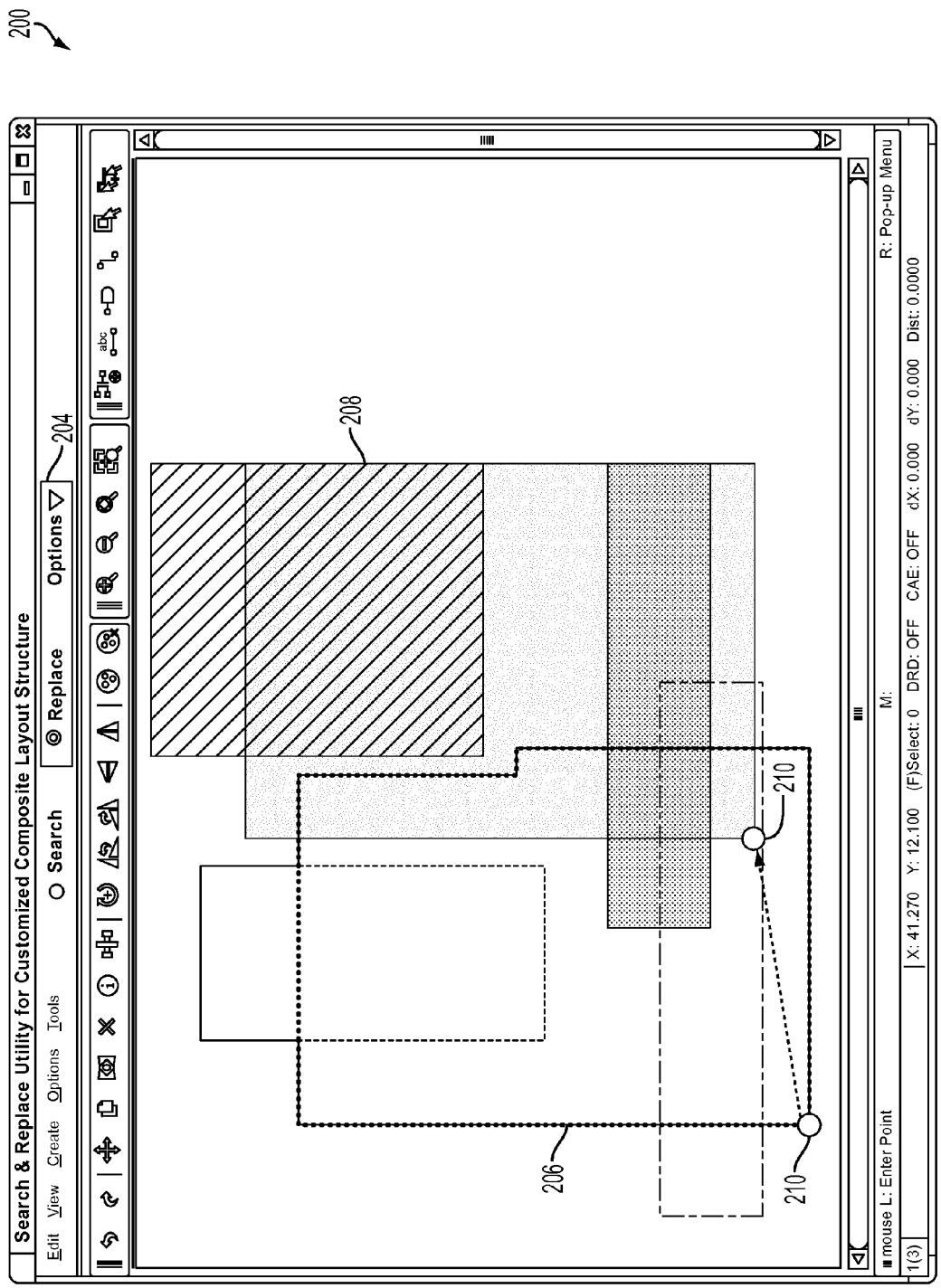
FIG. 20 is a diagrammatic view of the replace interface in which a simultaneous view feature of the present invention is being employed.

FIG. 20 is a diagrammatic view of replace interface 200 in which a simultaneous view feature of the present invention is being employed. In this example, a user wants the replacement pattern object to be changed in position, i.e. displaced, relative to the position of the old existing object. For example, the user wants to search for a certain layout structure wherever it occurs in the design and then replace it by a new layout structure. However, the user also wants the new structure to be slightly displaced from the existing structure location by, for example, 0.5 u in the x-direction.

To ease the user's defining of such a replacement pattern, a feature referred to herein as "simultaneous view" can be included in interface 200. If the user selects a simultaneous view selection from a list of options displayed from the selection of the replacement option control 204, then both the search pattern 206 (reflecting the structure currently in the design) and the replacement pattern (new structure) 208 are displayed in the canvas of the replace interface 200. Both of the patterns 206 and 208 can be dragged (or otherwise moved) by the user as independent entities. The user can drag the search pattern and the replacement pattern to adjust their relative displacement with respect to each other. The simultaneous dual view of both the patterns makes the task easier of adjusting a relative spatial displacement between these two structures. Once the replace operation is performed, each instance (old structure) of the design that matches the search pattern 206 (based on user search criteria) will be replaced by the new structure of the replacement pattern 208, where the new structure will replace the old structure at the exact relative displacement to the search pattern 206 as shown in the interface 200. If no displacement between search pattern and replacement pattern is input by the user, then the replace pattern simply replaces the matched pattern at the same coordinates, i.e. with no displacement.

FIG. 20 shows the simultaneous view for indicating the relative spatial displacement of the new structure in both X and Y dimensions. The search pattern 206 is shown dimmed and has a bright outline, while the replacement pattern (new structure) 208 is in normal color. This makes it easier to work with both structures and distinguish one from the other. Furthermore, a reference point 210 on both the search pattern 206 and the replacement pattern 208 is highlighted, and an arrow is drawn from the point 210 on the search pattern to the point 210 on the replacement pattern. This indicates the resulting displacement to the user in an easily-viewed graphical manner. A simultaneous view of schematic objects for use with a schematic design can be similarly implemented.

In addition to the replacement capabilities described elsewhere herein, the replacement operation of the present invention is also capable of searching and replacing constraints and their values. A constraint is a characteristic of a device that limits changes to the device to the specified constraint range or value. In one example, a search pattern may include 2 devices with a certain connection and also including a matched-pair constraint on those devices. The matched-pair constraint requires that both of the devices need to be matched as pair, or no match is considered to have occurred. In another example, a distance constraint can specify that the matched pair cannot be further apart than a specified distance. The user can specify a replacement pattern with a changed connected or changed device, and also may include a changed constraint. The search feature of the invention can search for constraint(s) specified in a search pattern to match those constraints, and the replace feature is able to replace constraints in matched instances—for example, updating the constraint to a new value, deleting the constraint, adding a constraint, etc.

Figure 21A:
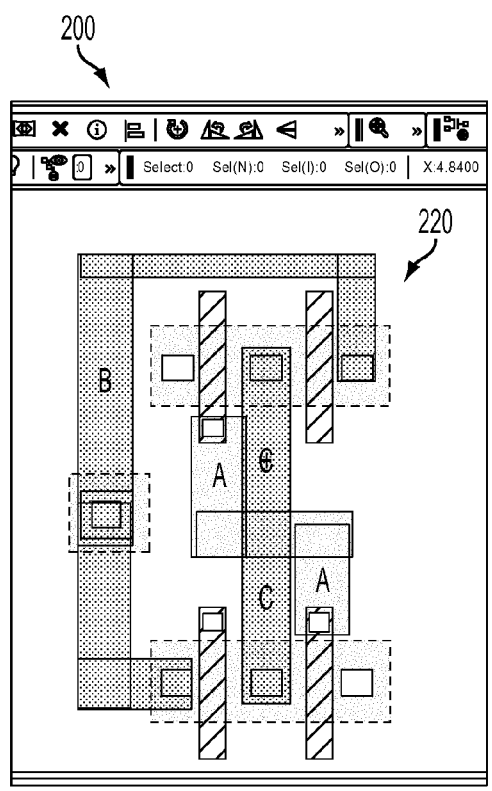
FIGS. 21A and 21B are diagrammatic views illustrating connectivity-aware intelligent replacement of structures according to one embodiment of the present invention.
Figure 21B:
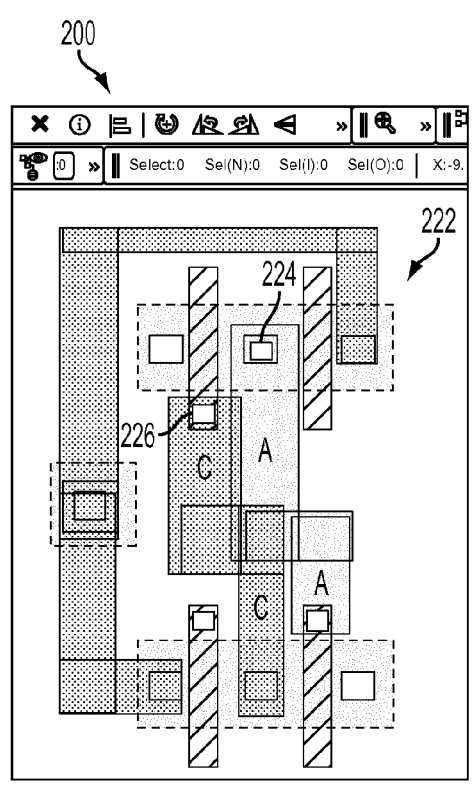

FIGS. 21A and 21B are diagrammatic views illustrating connectivity-aware intelligent replacement of graphical objects according to one embodiment of the present invention. One potential issue with replacement of an old object with a new object is that the connectivity of components in the object may be changed. For example, a new layout structure may not connect to an existing trace because it is of a shortened width. Or, a new schematic object may cause one device of the object to no longer be connected to a different device.

In the present invention, an intelligent connectivity-aware feature can provide feedback to the user if the connectivity is changed due to the replacement operation. For example, the replacement engine can provide textual and/or visual feedback to the user. This is achieved by allowing the replacement mechanism to use the existing connectivity checker of the graphical design application. Such a connectivity checker is used in existing applications to check connectivity of components in a design according to predetermined rules. Such connectivity checking can prevent inadvertent modification of the connectivity if used during the replacement of structures. For example, the replacement mechanism can warn the user of connectivity changes and/or functionality changes (and/or rule violations) in the design that would occur if the search pattern object were replaced with the replacement pattern object in the design. In some embodiments, the interface 200 can run the connectivity checker at any time that the user is creating or editing a replacement pattern in the interface 200. Other embodiments can check connectivity at discrete times, such as before or after a replacement operation.

FIG. 21A shows an example of a layout structure 220 including connections between two transistors. The labels A, B, and C each indicates a different net. The user wants to change the structure 220 to the structure 222 shown in FIG. 21B for every such occurrence of the structure 220 in the layout design, where the net A becomes shorted to net C in structure 222 at connection 224 and net A is becomes shorted to net C at connection 226. In other words, the nets A and C are mistakenly cross-connected between their respective terminals, creating a short, where one terminal of A is connected to the opposite terminal of C, while the remaining two terminals of both nets got connected to each other, causing a cross connection. Thus, the user specifies structure 220 as the search pattern and the structure 222 as the replacement pattern with appropriate replace options. In response to the user commanding this replacement operation, the replace mechanism of the interface 200 detects that the user is (probably mistakenly) trying to connect two separate nets together (C and A are getting shorted). In some embodiments, while the user is drawing/editing the replacement pattern 222 in the interface 200, then the replace engine (that performs replacement operations) can inform the user about the violation. If user still wishes to proceed and make the change, then the user can select to continue the replacement. This kind of intelligence makes it very easy for the user to rapidly work with the modification without having to worry about inadvertently changing the connectivity.

FIGS. 22A to 22E are diagrammatic views illustrating a feature of the present invention for connectivity-aware auto-replacement between different types of designs, such between a layout design and a schematic design. This feature allows a user to perform search and replacement in one type of design (schematic or layout, for example), and have the replacements automatically made in a related or corresponding other type of design (a corresponding layout or schematic, for example).

Figure 22A:
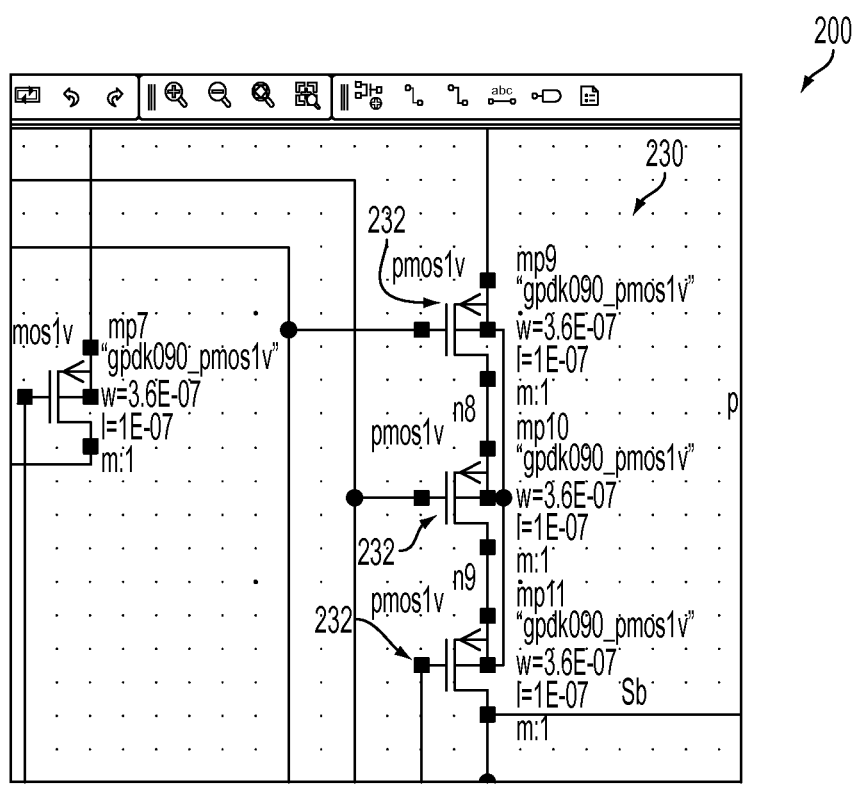
FIGS. 22A to 22E are diagrammatic views illustrating a feature of the present invention for connectivity-aware auto-replacement between different types of designs.
Figure 22B:
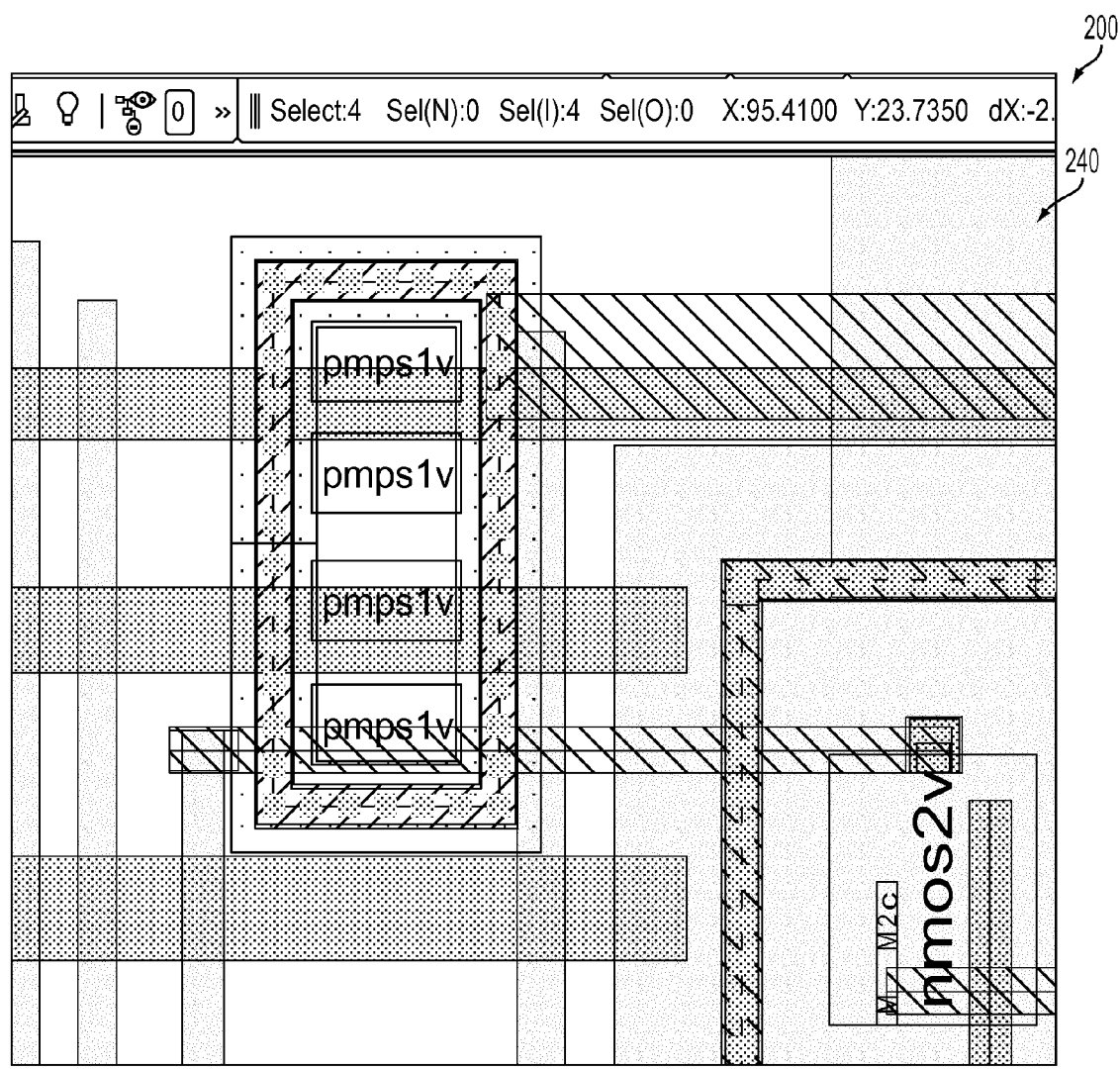

FIG. 22A illustrates an example in which there are a large number of devices in a schematic design 230 displayed in the replace interface 200. The schematic design 230 includes a number of specific transistors 232 having properties of: a master identifier of "pmos1v," a transistor width (W) of 3.6e-7 meters, and a multiplication factor (m) of 1. In this example, there are 45 such devices in the schematic design. FIG. 22B illustrates a layout design 240 that corresponds to the schematic design 230 of FIG. 22A. For example, this layout design 240 may have been generated from the schematic design 230 using the graphical design application.

The user wants to replace all of the 45 devices 232 in the schematic design with a higher strength device whose characteristics are the same as the devices 232 except for these differences: a master identifier of "pmos2v," a transistor width (W) of 3.8e-7 meters, and a multiplication factor (m) of 2. It should be noted that both old schematic object and replacement schematic object can be p-cells, or either one of them can be a p-cell, or none of them need be a p-cell, this is irrelevant to the search and replace operation.

Using the auto-replacement between the two designs, there are two tasks here for each of the 45 instances of the devices: first, to update the schematic design, and second to then update the layout design. This is a task that, if performed manually, would take several days for both schematic designer and layout designer combined. The present invention, however, makes this task very easy—e.g., performed within a matter of minutes—by providing a connectivity-aware replacement capability.

Figure 22C:
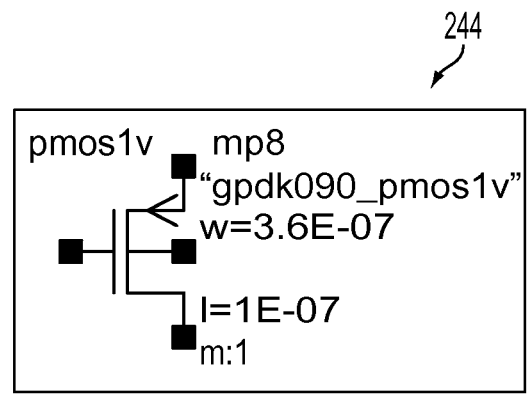
Figure 22D:
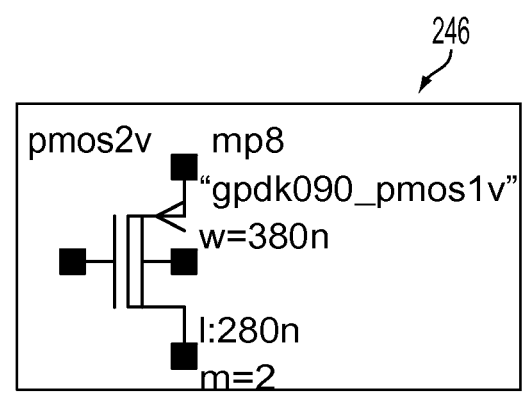

In this example, a user first defines a search pattern and replacement pattern for the schematic design. FIG. 22C shows one example of a search pattern 244 defining the device 232 which is to be found in the design, and FIG. 22D shows an example of a replacement pattern 246 defining the device which is to replace the found devices 232, including the changed parameters as described above. The user then can select to "replace all" matched instances with the replacement pattern 246. The user also selects to perform a connection-based replacement for a layout design that exists on the system and corresponds to the schematic design. For example, in one embodiment, the user can select a button or checkbox in a replace form to perform this corresponding replacement, which is discussed in greater detail below with respect to FIG. 23.

The system will then perform an intelligent replacement. It will first replace the schematic instances 232 as desired by the user. Then the system determines whether a corresponding layout design exists for this schematic design. If so, the system will check if connectivity is established between the layout and schematic, i.e. whether the connections of the schematic are specifically correlated with corresponding connections in the layout. If so, then the system checks whether devices corresponding to the search pattern identifier "pmos1v" are instantiated in the layout and whether the parameters of devices 232 match the parameters of the search pattern. If this is true, then the system checks whether a layout structure has been created by the user and made available as a replacement pattern for this replace operation, e.g., a "pmos2v" layout view. If so, it is checked whether the corresponding replacement layout structure is the correct type of device (here, a p-cell) whose parameters match the parameters of the desired schematic replacement structure 246. The system can also check whether there is an existing designed layout cell view stored in a database or storage device that matches the desired W/L values of the replacement structure 246. If a corresponding replacement layout structure is found, then the system automatically replaces the old layout structures ("pmos1v") with the replacement layout structures ("pmos2v") along with the desired structural characteristics and property-based characteristics (e.g., values of W, L, magnification factor, etc.).

Figure 22E:
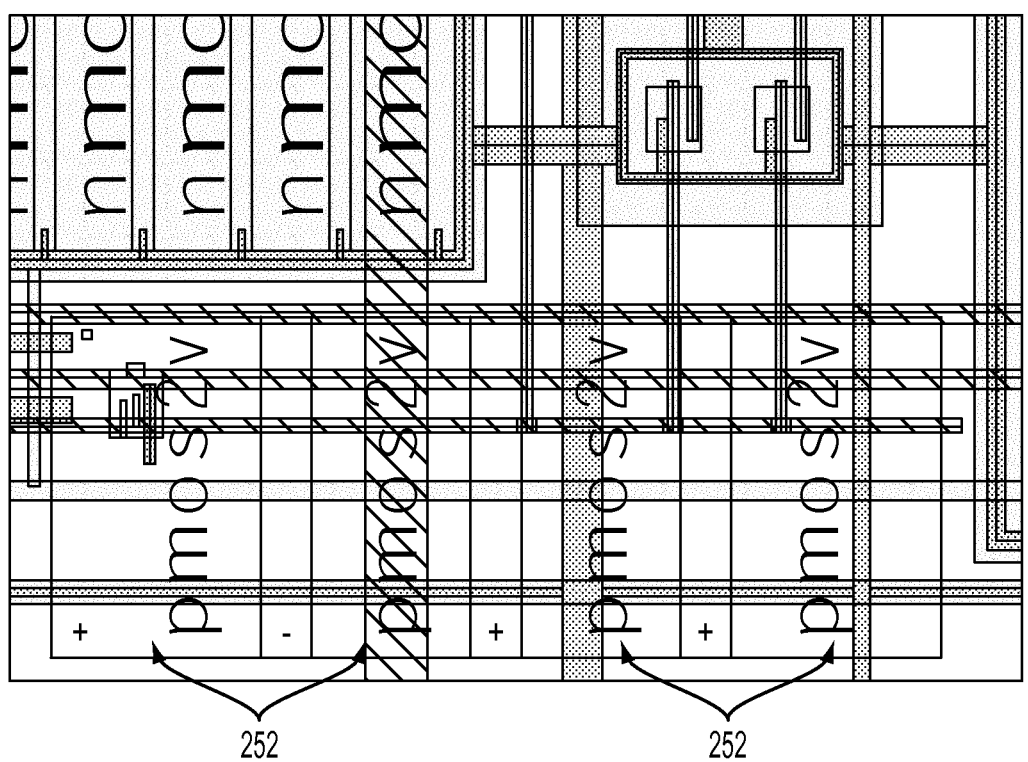

FIG. 22E shows the resulting layout structure 250 that has been automatically modified with the layout version of the replacement pattern to be in accordance with the corresponding schematic structure. The "pmos2v" devices 252 have been updated in the layout structures lined at the bottom of the figure, thus saving the user a lot time and effort.

The result of the replacement operation in the corresponding design may not be exactly as the user wished. For example, the replacement structure pmos2v is much bigger than pmos1v in the described example. In some cases, the automatic design rules check (DRC) of the corresponding design may provide warnings about an illegal change in that design. In such cases, the user can simply edit the corresponding design as needed, e.g., move or place connections or shapes at a clean location and re-route any moved shapes in a corresponding layout design. However, in any case the entire task of updating the original design, updating the corresponding design, and keeping the designs in synchronization is significantly reduced in time and effort. This feature reduces the required work and increases productivity for a designer.

In summary, the invention can provide an independent search and replace capability in a schematic design and in a layout design. The invention can also tie the two search and replace operations using intelligent connectivity mapping. The result is a powerful mechanism to auto-replace applicable entities in a corresponding different type of design when a search-replace operation is performed in a first type of design, based on connectivity mapping between schematic and layout. This is possible by tying the search and replace capabilities described above with the connectivity binding engines which keep the layout and schematic in synchronization from a connectivity standpoint. The auto-replacement can be performed as described above, such that a search-replace operation is performed in a schematic design it can also be performed in a layout design. Or the opposite situation can be performed: when a search-replace operation is performed in a layout design, the update can also be automatically performed in a corresponding schematic design. This auto-update can be performed across a hierarchy of design levels as well.

Figure 23:
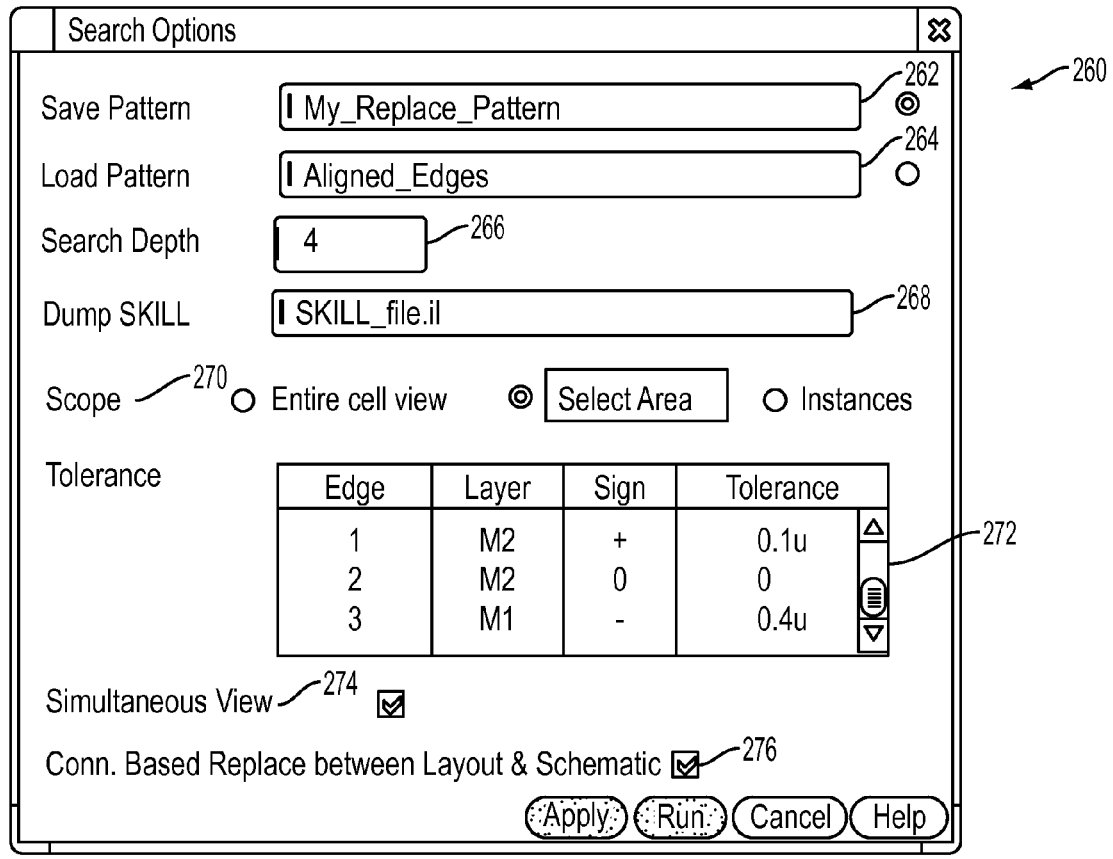
FIG. 23 is a diagrammatic illustration of an example of a replace options form used with the replace interface of the present invention.

FIG. 23 is a diagrammatic illustration of an example 260 of a replace options form used with the replace interface 200 of the present invention. Replace options form 260 can be displayed as a separate dialog box or window from search interface 200 when an appropriate command is input by the user. Alternatively, the options form 260 can be displayed within the interface 200. In the embodiment of FIG. 18, for example, form 260 can be invoked by the user selecting the replace option selection 204, or by a menu command or hotkey command.

Form 260 includes several options for the user to manipulate a replacement pattern in the interface 200. Input field 262 allows the user to save a replacement pattern (such as replacement pattern 212) by inputting an identifier for the replacement pattern, such as a filename, and store the replacement pattern to a storage device (e.g. storage device 18). In a load field 264, a saved replacement pattern can be specified by the user by inputting its identifier and loaded into the interface 200, to then be modified and/or used as the basis of a replacement operation. Saving and loading options are important in the present invention since users can define complex replacement patterns. A replace depth field 266 allows the user to specify the particular hierarchy level, or range of hierarchy levels, of the design that the replace operation will cover. For example, the user has defined a specific hierarchy depth of 4 in field 266, and wants to replace a certain size of transistor by another size of transistor. A replacement operation will perform this change for all transistors that are in the $4^{th}$ hierarchy level, and ignore transistors outside this hierarchy level. A hierarchy range can also be specified, which allows the replacement operation to be performed in all hierarchy levels in the specified range.

A dump SKILL field 268 allows a user to output SKILL code (or code of a different programming language in other embodiments) that describes a replacement pattern defined in the interface 200, and store the skill code separately. This allows further reuse of the replacement pattern that has been created for other uses, e.g., script-related tasks. The scope field 270 allows the user to specify portions or an area of the design to which the replace operations will be limited. For example, the user can select whether the replace operation for the specified replace pattern will be performed for the entire design (e.g. cell view), a specific area, or specific instances, and can specify the specific area or instances similarly to the scope field 170 of the search options form 160 of FIG. 16. In addition, the user can replace rotated instances of the matched instances.

The tolerance table 272 defines the tolerance values for each edge of the layout structure that has been defined in the replace interface 200, similarly as described above for the search operation. A tolerance report can be selected for generation and output as well (not shown), similarly to the search options form described above with respect to FIG. 16. Form 260 can also include a "view replace toolbar" selection option (not shown) similar to option 176 of FIG. 16, but in this case displays the view replace results toolbar described below with respect to FIG. 24. A simultaneous view option 274 can be selected by the user to display a simultaneous view of the old structure and the new replacement structure, as described above with reference to FIG. 20. A connection-based replace option 276 can be selected by the user to provide additional replacement in corresponding designs, as described above with reference to FIGS. 22A-22E.

Figure 24:
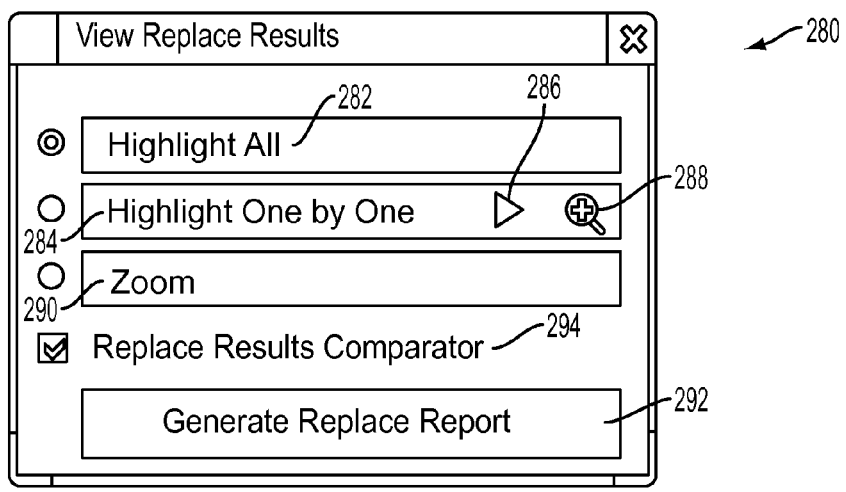
FIG. 24 is a diagrammatic illustration of an example of a view replace results toolbar used with the replace interface and replace options form of the present invention.

FIG. 24 is a diagrammatic illustration of an example 280 of a view replace results toolbar that can be used with the replace interface 200 and replace options form 260 of the present invention. View replace results toolbar 280 can be displayed as a separate toolbar, dialog box or window from search interface 200 when invoked by a selection in the replace options form 260 of FIG. 23, or otherwise invoked by an appropriate command input by the user. Alternatively, the view toolbar 280 can be displayed within the interface 200. The view replace results toolbar 280 allows the user to view all the instances in the design that were replaced by the replacement pattern, and can allow the user to cycle through the replace results in detail.

Toolbar 280 includes several options for the user to view the replace results from a replace operation that are similar to corresponding options in the search results toolbar 180 of FIG. 17. The Highlight All option 282 allows the user to highlight all the replaced instances as a selected set in the main layout canvas from a high zoom level. The Highlight One by One option 284 allows the user to highlight one searched instance at a time in the main layout canvas in interface 200, and can select the "Next" button 286 to shift the highlight cursor to another instance. The zoom icon 288 allows the user to zoom into a selected instance or area of the canvas for a closer displayed view. The Zoom option 290 selects a mode in which the user is always zoomed into the viewed replace result, and selecting the "Next" button 286 changes the view to the next replace result at the zoomed-in level. The Generate Replace Report option 292, when selected, creates a text report of the replaced instance(s) including specified properties. For example, the report can include location coordinates and layers in which the replaced instances are located. If the tolerance report option was selected in the options form 260, then a tabular report is generated based on the tolerances as explained above.

The view replace results toolbar 280 also includes a replace results comparator option 294. This option causes the interface 200 to display one of the old, replaced objects alongside the new, replaced object after the replacement operation has completed, and thus allows the user to visually compare the old and new structures.

Figure 25:
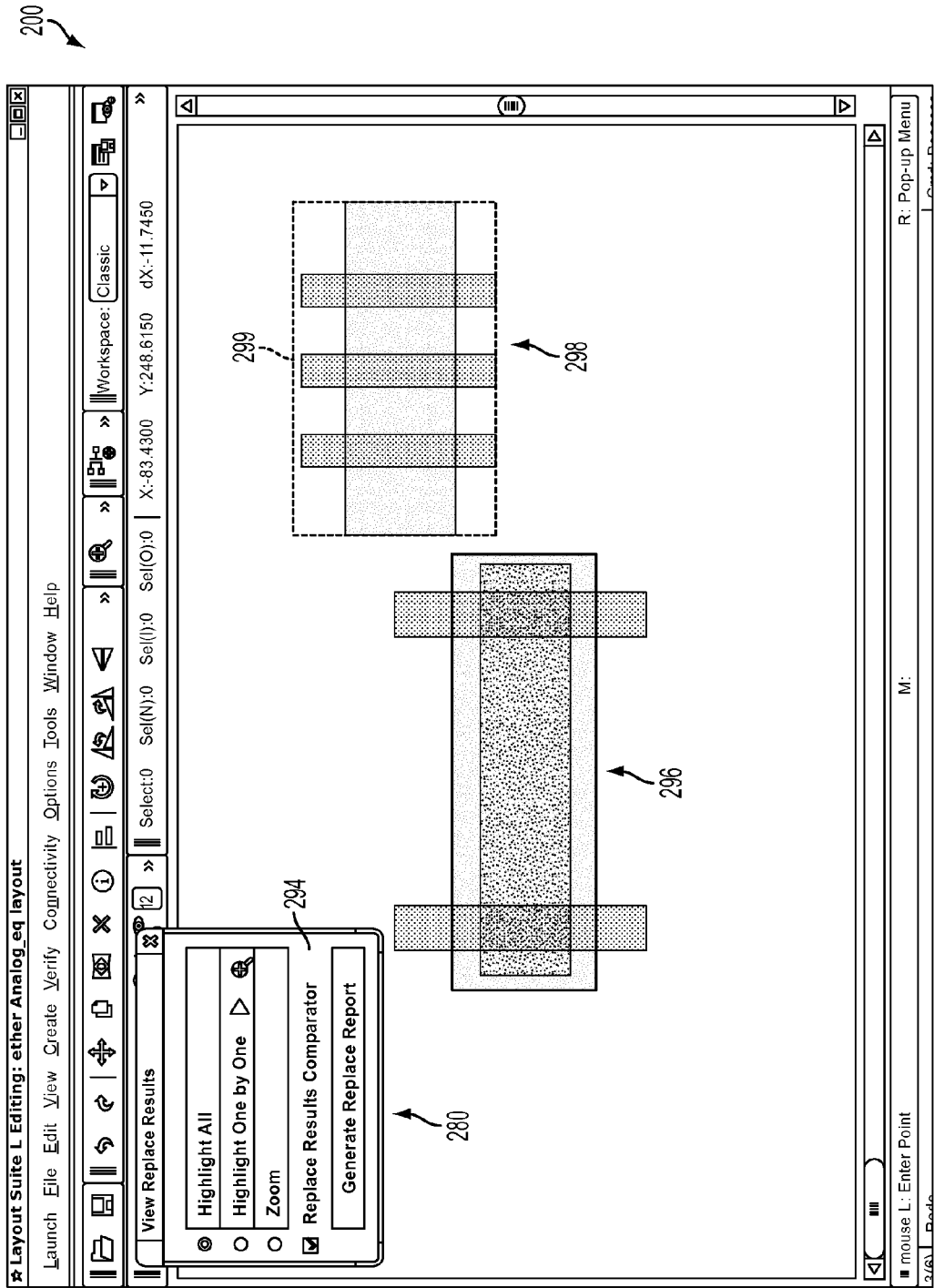
FIG. 25 is a diagrammatic illustration showing a compared display of a replaced structure and a new replacement structure in a layout design.

For example, FIG. 25 shows the replace interface 200 and the view replace results toolbar 280 displayed to one side of the interface 200. In this layout design example having structures, all the replacements desired by the user have been performed and the user is now reviewing them. For some of the replacements, the user wants to compare the original, pre-replacement structure alongside the new, replaced structure. This can be an important feature in many situations. For example, the user may be trying to adjust the replacement pattern in a small, congested area of the screen and wants to see the placement of the original structure for reference.

In such a case, the user can select the "Replace Results Comparator" option 294 in toolbar 280 to cause a display of the old structure. FIG. 25 shows an example for a layout design; a schematic design can also use this feature. The new structure 296 is shown normally in its location in the design, and the old, original structure 298 is displayed nearby in the interface 200. In some embodiments, the old structure 298 can be highlighted in some fashion to distinguish it from the actual structures in the design. For example, a dotted box 299 is displayed surrounding the old structure 298 in the example of FIG. 25, such that the old structure 298 is portrayed as a "ghost view." In some embodiments, the user can move the old structure 298 as desired, relative to the new structure 296 and other design features displayed in interface 200. When the user de-selects the replace results comparator option 294, the old structure 298 is removed from the screen. Thus, the ghost view can be used after replacement to compare previous and replaced objects in a design.

Figure 26:
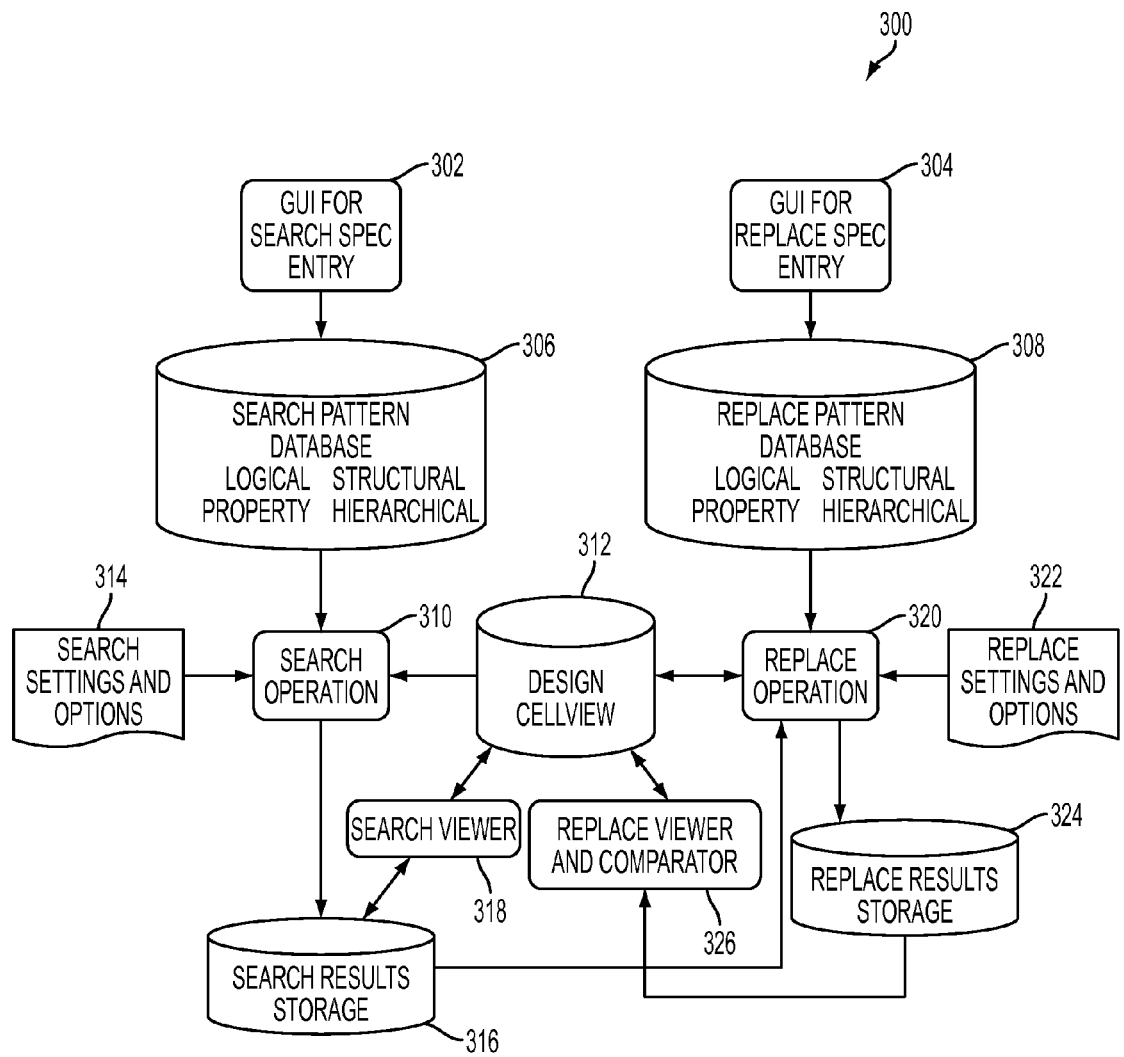
FIG. 26 is a block diagram illustrating components and data flow of the present invention for the search and replace operations described herein.

FIG. 26 is a block diagram 300 illustrating components and data flow of the present invention for the search and replace operations described above. The components and data flow are implemented on a computer system or device, such as system 10 of FIG. 1, and can be implemented by program instructions or code, which can be stored on a computer readable medium in a computer program product. Alternatively, the components and data flow can be implemented in hardware (logic gates, etc.), or in a combination of hardware and software.

The search and replace patterns are input by one or more users at steps 302 and 304, respectively. These patterns are stored in respective databases 306 and 308 where the different characteristics of the pattern such as logical, structural, hierarchical and property-based characteristics are maintained.

The search operation 310, implemented by the search interface 110, then reads data needed for its operation. The search operation reads the design canvas data (shown as a cellview in FIG. 26) from the design database 312, reads the search pattern from the Search Pattern Database 306, and reads user defined search settings and options 312, e.g. options specified in the search interface 110, the options form 160, and the toolbar 170. Then the search operation is performed, and the matched instances in the design are stored in Search Results Storage database 316. A Search Results Viewer 318 sits between the storage 316 and the design database 312 and displays the matched instances in the main canvas based on the view toolbar 170.

The replace operation 320, implemented by the replace interface 200, then reads data needed for its operation. The replace operation reads the design canvas data from the design database 312, reads the matched patterns resulting from the search operation from storage 316, reads replacement pattern from the Replace Pattern Database 308, and reads user-defined settings and options 322 for replacements, e.g. options specified in the replace interface 200, the options form 260, and the toolbar 280. Then the (smart) replace operation is performed such that all occurrences matching the search pattern are replaced by the replace pattern. The replaced results data are stored in the Replace Results Storage 324. Such replaced results data can include, for example, data describing the instances (including layout structures or other objects, layers of the objects, etc.) that were replaced, a database ID of the instances, coordinates where replacement is made, etc. Thus, info that identifies a replacement and is required to reflect the replacement results on the design view for the user to see and manipulate further, is stored in Storage 324. A Replace Viewer and Comparator 326 then reads the replace results from the Replace Results Storage 324 and displays the replacements in the interface 200 based on the options in the view toolbar 280 and/or other user-selected options.

Figure 27:
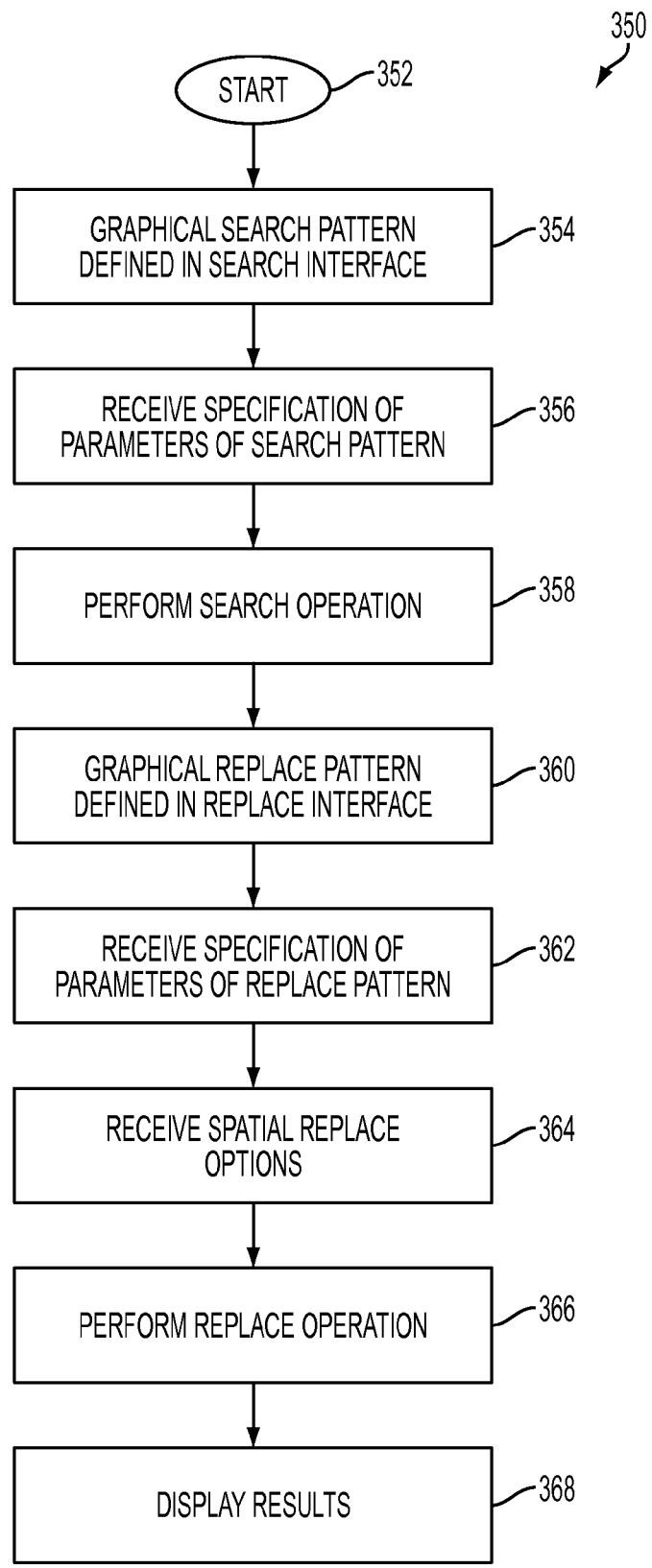
FIG. 27 is a flow diagram illustrating an example of a method of the present inventions for providing and performing graphical search and replace functions.

FIG. 27 is a flow diagram illustrating one example of a method 350 of the present invention for providing and performing graphical search and replace functions. Method 350 can be implemented, for example, by the components in system 10, e.g., by one or more modules within the graphical application 15. Method 350 can be implemented by program instructions or code, which can be stored on a computer readable medium in a computer program product. Alternatively, the method 350 can be implemented in hardware (logic gates, etc.), or in a combination of hardware and software.

The method begins at 352, and in step 354, a graphical search pattern is specified by the user within the search interface 110. The user graphically defines the pattern using the features and tools of the search interface 110. In some embodiments, there are separate interfaces for specifying schematic search patterns and for specifying layout search patterns, with tools/options specific for each of the schematic and layout designs.

In step 356, the system receives parameters for the specified search pattern which the user has selected in the interface 110 or otherwise input. For example, the user can define the characteristics of the search pattern that are to be matched exactly, the characteristics that are Don't-Care, and the characteristics which should be matched but with a specified allowed tolerance. These characteristics can be schematic and layout structural dimensions, connectivity descriptions, properties-related dimensions and characteristics, and logical characteristics. In some embodiments this parameter specification can be input in the same interface as the search pattern specification.

In step 358, the search operation is performed when so instructed by the user. The graphical design application searches for every instance in the design that matches the search pattern according to the chosen options and search-scope (such as search hierarchy, etc.). The graphical design application can display search results to the user according to chosen viewing options.

In step 360, a graphical replace pattern is specified by the user in the replace interface 200 (which can be the same interface as the search interface 110, or a different or separate interface). The user graphically defines a graphical object as a replace pattern using the tools and options of the replace interface. In some embodiments, there is one interface for specifying schematic replace patterns, and a separate interface for specifying layout replace patterns, each with tools and options specific for replacement purposes. In step 362, the specification of parameters (e.g. structural, logical, hierarchical, and properties-based characteristics) is received, the characteristics of the matched instances to be changed by the replacement operation based on the replacement pattern, or in some cases, appended to existing characteristics. In step 364, spatial replace options specified by the user are received, e.g. from the same replace interface or different interface. For example, the user can define replace options and relative displacements using provided assistants in the interface 200.

In step 366, a replace operation is performed. The graphical design application replaces every instance that matches the search pattern with the replacement pattern, according to chosen options and scope of replacement. In step 368, the graphical application displays the results in interface 200 (or other appropriate interface) for the user to view.

It should be noted that the steps described for method 350 need not be performed in the order presented in FIG. 27. For example, the replace pattern and parameter specification of steps 362-364 can be performed before, during, or after other steps of method 350, and can be provided in an order other than the one described. Furthermore, additional steps may be performed in other embodiments depending on the results desired. For example, if the automatic replacement between different types of designs (as in FIGS. 22A-22E) is desired, then the system will perform the steps of checking for other corresponding designs and so on, as described above.

The search and replace features of the present inventions provide many advantages to a user viewing and manipulating designs in a graphical interface. A designer can specify a search pattern and replacement pattern graphically, where the patterns can be graphically created and edited using an interface and tools with which the designer is already very familiar and skilled, thus reducing mistakes and time spent. Thus a search pattern and replace pattern is provided directly from a graphical definition, with no intermediate coded or language-based forms or formats needed. A number of features of the invention allow the user to easily find and change desired aspects of the design for a large number of similar objects in the design.

In other embodiments, other types of graphical designs can be displayed in interface 100 other than layout design or schematic design. In some embodiments, other applications or designs such as line drawings, graphical objects, photo images, maps, or other images can be displayed, created and/or edited for search and replacement similarly to the design types described herein. Such other embodiments and applications also may need search and replacement of multiple instances in a design using a graphical interface, and thus can also benefit from the present inventions.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for searching for graphical objects in a graphical circuit design using a computer system, the method comprising:
   defining a graphical search pattern as a graphical object in a graphical interface displayed on a display device, wherein the graphical search pattern is defined with a plurality of types of characteristics, wherein the plurality of types of characteristics include a graphical edge of the graphical search pattern;
   receiving a tolerance parameter applying to the graphical edge, wherein the tolerance parameter defines a range of positions for the graphical edge of the graphical search pattern such that any instance having an edge within the range of positions is considered to match the graphical edge;
   graphically displaying the tolerance parameter on the display device as a graphical area shape displayed adjacent to the graphical edge, the graphical area shape having a size based on the range of positions defined by the tolerance parameter;
   searching the graphical circuit design for all matching instances of graphical objects in the graphical circuit design that match the graphical search pattern and match the characteristics specified by the graphical search pattern based on the tolerance parameter, wherein the searching includes comparing the characteristics specified by the graphical search pattern to characteristics of a plurality of instances of graphical objects in the graphical circuit design; and
   causing a display of at least one of the matching instances on the display device as a result of the searching.

2. The method of claim 1 wherein the graphical circuit design is an electronic schematic design and the graphical search pattern includes at least one schematic object.

3. The method of claim 1 wherein the graphical circuit design is an electronic layout design and the graphical search pattern includes at least one layout structure.

4. The method of claim 1 further comprising receiving user input that graphically manipulates the graphical object, wherein the graphical manipulation of the graphical object includes at least one of: selecting a displayed object of the graphical design as the graphical object, copying an object of the graphical design to a search interface, drawing the graphical object, and editing a displayed object of the graphical design to be the graphical object.

5. The method of claim 1 wherein the graphical search pattern is defined with the plurality of types of characteristics that include a connectivity characteristic specifying a connection of the graphical search pattern to a particular connectivity network within the circuit design.

6. The method of claim 1 further comprising receiving parameters defining the graphical search pattern and the plurality of types of characteristics, and wherein the searching the graphical design for matching instances includes searching based on the parameters, the plurality of types of characteristics including a property-based characteristic including at least one electrical property.

7. The method of claim 1 further comprising receiving parameters defining the graphical search pattern, and wherein the parameters include a designation of at least one characteristic of the graphical search pattern object as a don't-care characteristic that is ignored for the search.

8. The method of claim 1 wherein the graphical search pattern is defined with a plurality of types of characteristics that include a constraint characteristic defining at least one constraint specifying a design requirement for the graphical search pattern relative to at least one other component of the graphical circuit design, and wherein the constraint characteristic includes a distance constraint indicating a required distance range between the graphical search pattern and the at least one other component of the graphical circuit design.

9. The method of claim 1 wherein the graphical search pattern is defined with the plurality of types of characteristics that include a constraint characteristic defining at least one constraint specifying a design requirement for the graphical search pattern relative to at least one other component of the graphical circuit design, and further comprising receiving at least one additional tolerance parameter for the graphical search pattern, the at least one additional tolerance parameter applying to the constraint characteristic and defining a range of values for the constraint characteristic such that any value within the range of values is considered to match.

10. The method of claim 1 wherein the plurality of types of characteristics further include a property-based characteristic including at least one electrical property, and a structural characteristic including a dimensional property of the graphical search pattern, and further comprising receiving an additional tolerance parameter applying to at least one of the property-based characteristic and the structural characteristic, wherein the additional tolerance parameter defines a range of values such that any value within the range of values is considered to match.

11. The method of claim 1 wherein the plurality of types of characteristics further include a dimensional property of the graphical search pattern, and further comprising receiving an additional tolerance parameter applying to the dimensional property, wherein the additional tolerance parameter defines a range of positions for the dimensional property of the graphical search pattern such that any instance having a dimension within the range of positions is considered to match, and wherein the additional tolerance parameter is specified graphically on the graphical object by displaying the range of positions of the dimensional property.

12. The method of claim 1 wherein the plurality of types of characteristics further include a user-defined hierarchical characteristic specifying one or more hierarchical levels of the graphical circuit design in which the graphical search pattern is located, wherein the specified one or more hierarchical levels are a subset of a plurality of hierarchical levels of the graphical circuit design.

13. The method of claim 1 wherein the specified one or more hierarchical levels are numerically defined by the user.

14. The method of claim 1 further comprising receiving a designation of an area or one or more instances of the graphical design from the user, wherein the searching is limited to the designated area or the one or more instances.

15. The method of claim 4 wherein the graphical interface is displayed within a predefined viewing area of the display device, the predefined viewing area being bounded by a screen size of a screen of the display device.

16. The method of claim 1 further comprising:
replacing the matching instances of graphical objects in the graphical design with a user-defined replacement pattern.

17. A computer program product comprising a non-transitory computer readable medium including program instructions to be implemented by a computer and for searching for graphical objects in a graphical circuit design using a computer system, the program instructions for:
defining a graphical search pattern as a graphical object in a graphical interface displayed on a display device, wherein the graphical search pattern is defined with a plurality of types of characteristics, wherein the plurality of types of characteristics include a graphical edge of the graphical search pattern;
receiving a tolerance parameter applying to the graphical edge, wherein the tolerance parameter defines a range of positions for the graphical edge of the graphical search pattern such that any instance having an edge within the range of positions is considered to match the graphical edge;
graphically displaying the tolerance parameter on the display device as a graphical area shape displayed adjacent to the graphical edge, the graphical area shape having a size based on the range of positions defined by the tolerance parameter;
searching the graphical design for all matching instances of graphical objects in the graphical circuit design that match the graphical search pattern and match the characteristics specified by the graphical search pattern based on the tolerance parameter, wherein the searching includes comparing the characteristics specified by the graphical search pattern to characteristics of a plurality of instances of graphical objects in the graphical circuit design; and
causing a display of at least one of the matching instances on the display device as a result of the searching.

18. The computer program product of claim 17 wherein the graphical circuit design is an electronic layout design, and wherein the graphical area shape graphically displaying the tolerance parameter is a rectangular area having a side displayed adjacent to the graphical edge.

19. The computer program product of claim 17 further comprising receiving user input that graphically manipulates the graphical object, wherein the graphical manipulation of the graphical object includes at least one of: selecting an object of the graphical design as the graphical object, copying an object of the graphical design to a search interface, drawing the graphical object, and editing an object of the graphical design to be the graphical object.

20. The computer program product of claim 17 wherein the graphical search pattern is defined with the plurality of types of characteristics that include a constraint characteristic that defines at least one constraint specifying a design requirement for the graphical search pattern relative to at least one other component of the graphical circuit design.

21. The computer program product of claim 17 wherein the graphical search pattern is defined with the plurality of types of characteristics that include a connectivity characteristic specifying a connection of the graphical search pattern to a particular connectivity network within the circuit design.

22. The computer program product of claim 17 wherein the plurality of types of characteristics include a user-defined hierarchical characteristic specifying one or more hierarchical levels of the graphical circuit design in which the graphical search pattern is located, wherein the specified one or more hierarchical levels are a subset of a plurality of hierarchical levels of the graphical circuit design.

23. The computer program product of claim 17 further comprising receiving a designation of an area or one or more instances of the graphical design from the user, wherein the searching is limited to the designated area or the one or more instances.

24. A system for searching graphical objects in a graphical circuit design using a computer system, the system comprising:
a memory; and
a processor in communication with the memory, the processor:
defining a graphical search pattern as a graphical object in a graphical interface displayed on a display device, wherein the graphical search pattern is defined with a plurality of types of characteristics, wherein the plurality of types of characteristics include a graphical edge of the graphical search pattern;
receiving a tolerance parameter applying to the graphical edge, wherein the tolerance parameter defines a range of positions for the graphical edge of the graphical search pattern such that any instance having an edge within the range of positions is considered to match the graphical edge;
graphically displaying the tolerance parameter on the display device as a graphical area shape displayed adjacent to the graphical edge, the graphical area shape having a size based on the range of positions defined by the tolerance parameter;
searching the graphical design for all matching instances of graphical objects in the graphical circuit design that match the graphical search pattern and match the characteristics specified by the graphical search pattern based on the tolerance parameter, wherein the searching includes comparing the characteristics specified by the graphical search pattern to characteristics of a plurality of instances of graphical objects in the graphical circuit design; and
causing a display of at least one of the matching instances on the display device as a result of the searching.

25. The system of claim 24 wherein the graphical circuit design is an electronic schematic design or electronic layout design.

26. The system of claim 24 wherein the plurality of types of characteristics further include a user-defined hierarchical characteristic a specifying one or more hierarchical levels of the graphical circuit design in which the graphical search pattern is located, wherein the specified one or more hierarchical levels are a subset of a plurality of hierarchical levels of the graphical circuit design.

* * * * *